United States Patent
Hara et al.

(10) Patent No.: US 9,618,317 B2
(45) Date of Patent: Apr. 11, 2017

(54) POSITION INDICATOR AND CAPACITOR

(71) Applicant: Wacom Co., Ltd., Saitama (JP)

(72) Inventors: Kazuo Hara, Tokyo (JP); Takashi Yamaguchi, Saitama (JP)

(73) Assignee: Wacom Co., Ltd, Saitama (JP)

( * ) Notice: Subject to any disclaimer, the term of this patent is extended or adjusted under 35 U.S.C. 154(b) by 597 days.

(21) Appl. No.: 14/095,742

(22) Filed: Dec. 3, 2013

(65) Prior Publication Data

US 2014/0184245 A1 Jul. 3, 2014

(30) Foreign Application Priority Data

Dec. 27, 2012 (JP) ................................. 2012-286341

(51) Int. Cl.
*G01R 27/28* (2006.01)
*G01B 7/004* (2006.01)
(Continued)

(52) U.S. Cl.
CPC ............. *G01B 7/004* (2013.01); *G06F 3/038* (2013.01); *G06F 3/03545* (2013.01);
(Continued)

(58) Field of Classification Search
CPC ..... G01B 7/004; G06F 3/03545; G06F 3/038; H01G 4/005; H05K 1/181; H05K 2203/171
See application file for complete search history.

(56) References Cited

U.S. PATENT DOCUMENTS 5,159,524 A * 10/1992 Hasegawa .............. H01G 4/255
338/195
5,264,983 A * 11/1993 Petrinec .................. H01G 4/255
29/25.42
(Continued)

FOREIGN PATENT DOCUMENTS

JP 55-62721 A 5/1980
JP 57-168234 U 10/1982
(Continued)

OTHER PUBLICATIONS

Extended European Search Report dated Dec. 7, 2016, for corresponding EP Application No. 13197185.5—1972/2749995, 9 pages.
(Continued)

*Primary Examiner* — Daniel Miller
(74) *Attorney, Agent, or Firm* — Seed Intellectual Property Law Group LLP

(57) ABSTRACT

A position indicator includes a resonance circuit housed in a casing and having an inductance element and a capacitor variable in capacitance, such that the resonance circuit resonates at a predetermined frequency. The position indicator is electromagnetically coupled to a position detecting device. The capacitor includes a dielectric, an electrode disposed on one side of the dielectric, and a trimming electrode disposed on another side of the dielectric such that at least one part of a region of the trimming electrode is opposed to the electrode with the dielectric interposed in between, to form the capacitance of the capacitor. The capacitor is housed in the casing such that the at least one part can be exposed from the casing. The area of the at least one part exposed from the casing to the outside is changed so as to correspond to a resonance frequency desired for the resonance circuit.

15 Claims, 12 Drawing Sheets

(51) Int. Cl.
  *H01G 4/005* (2006.01)
  *G06F 3/038* (2013.01)
  *G06F 3/0354* (2013.01)
  *H05K 1/18* (2006.01)

(52) U.S. Cl.
  CPC ............ *H01G 4/005* (2013.01); *H05K 1/181* (2013.01); *H05K 2201/10015* (2013.01); *H05K 2203/107* (2013.01); *H05K 2203/171* (2013.01); *Y02P 70/611* (2015.11)

(56) References Cited

U.S. PATENT DOCUMENTS

| | | | |
|---|---|---|---|
| 6,002,576 A | | 12/1999 | Asakura et al. |
| 2005/0063135 A1* | 3/2005 | Borland | .............. H01G 4/01 361/303 |
| 2009/0250254 A1* | 10/2009 | Sufariu | ............... H05K 1/0295 174/260 |
| 2009/0253273 A1* | 10/2009 | Sano | ............... H01L 21/02683 438/795 |

FOREIGN PATENT DOCUMENTS

| | | |
|---|---|---|
| JP | 58-92724 U | 6/1983 |
| JP | 58-155824 U | 10/1983 |
| JP | 60-79727 U | 6/1985 |
| JP | 03-070171 A | 3/1991 |
| JP | 05-061590 A | 3/1993 |
| JP | 05283282 A | 10/1993 |
| JP | 07176451 A | 7/1995 |
| JP | 07183162 A | 7/1995 |
| JP | 10064753 A | 3/1998 |
| JP | 10214750 A | 8/1998 |
| JP | 10241991 A | 9/1998 |
| JP | 11219848 A | 8/1999 |
| JP | 2000-188233 A | 7/2000 |
| JP | 2001-313226 A | 11/2001 |
| JP | 2002244806 A | 8/2002 |
| WO | 93/06610 A1 | 4/1993 |
| WO | 02/103622 A2 | 12/2002 |

OTHER PUBLICATIONS

Japanese Office Action dated Jul. 27, 2016, for corresponding JP Application No. 2012-286341, 5 pages.

* cited by examiner

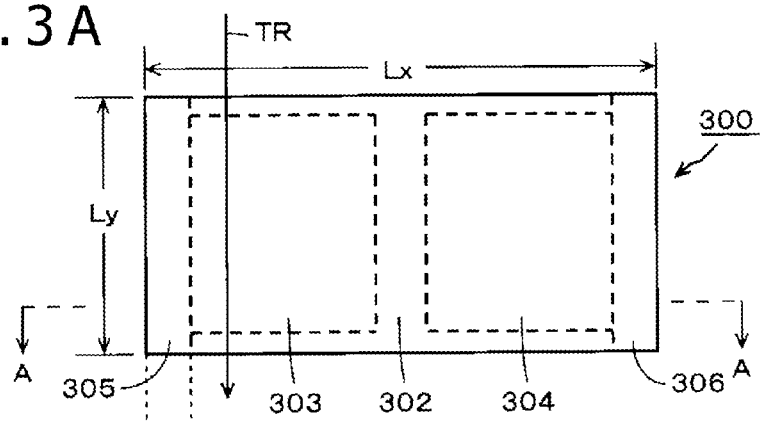
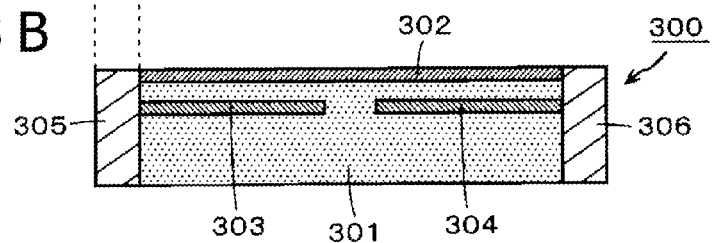
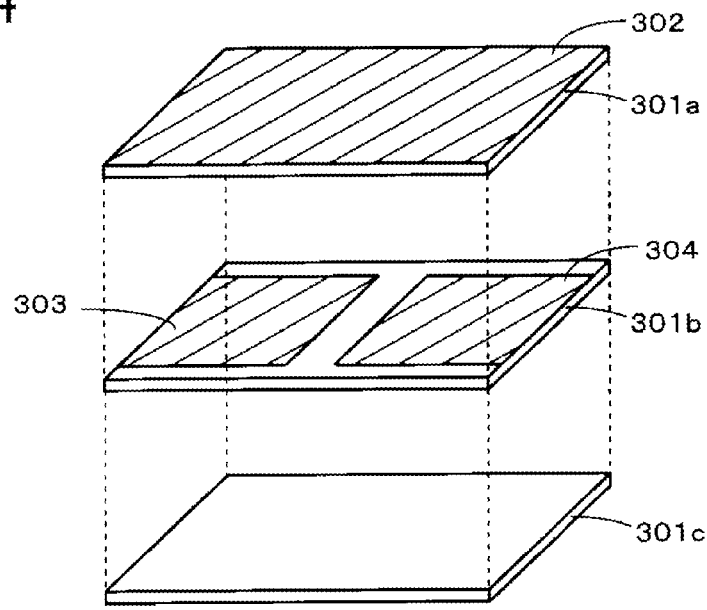

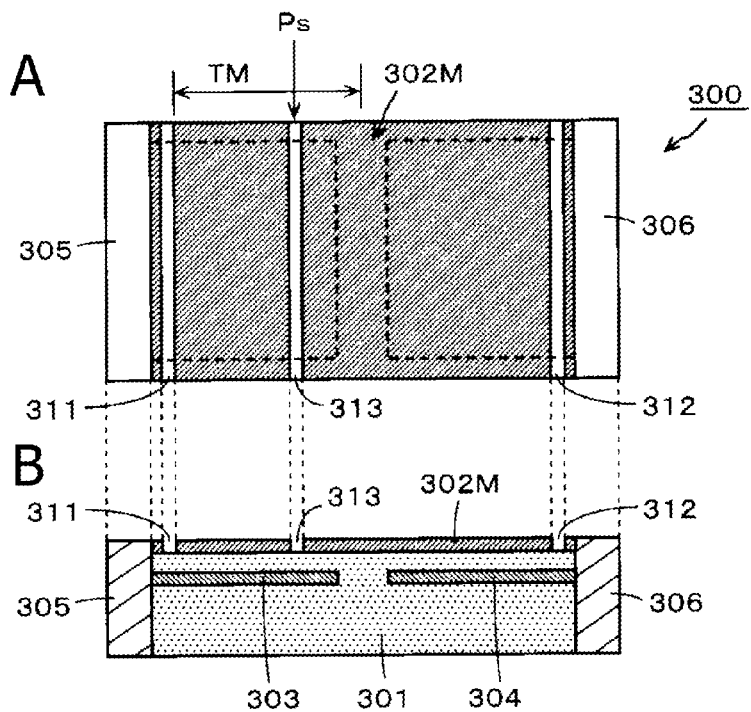
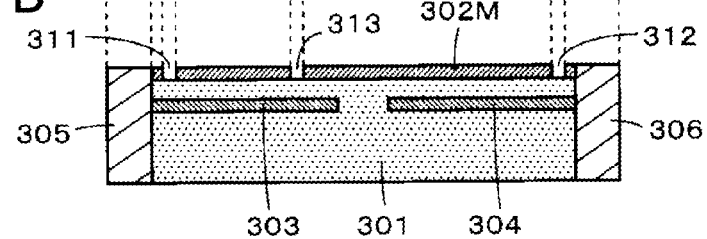

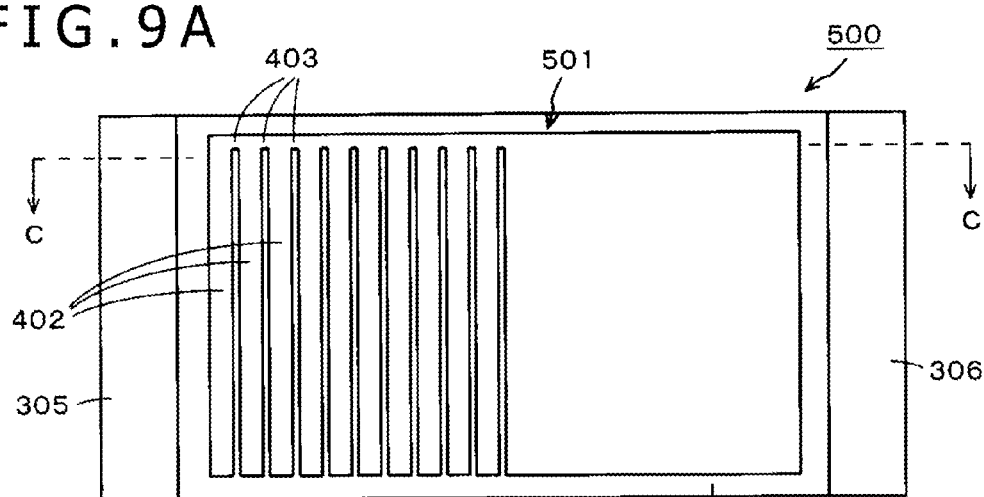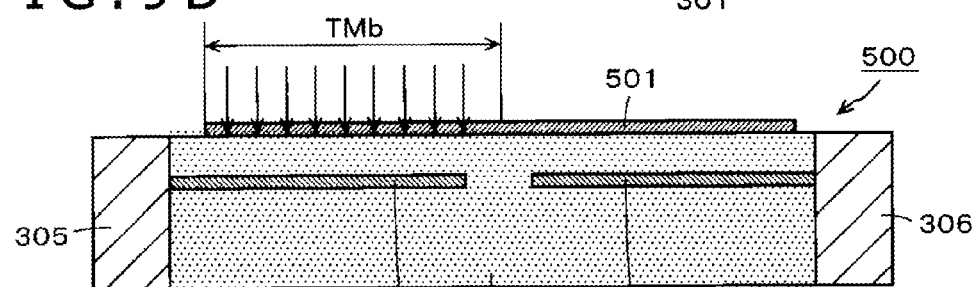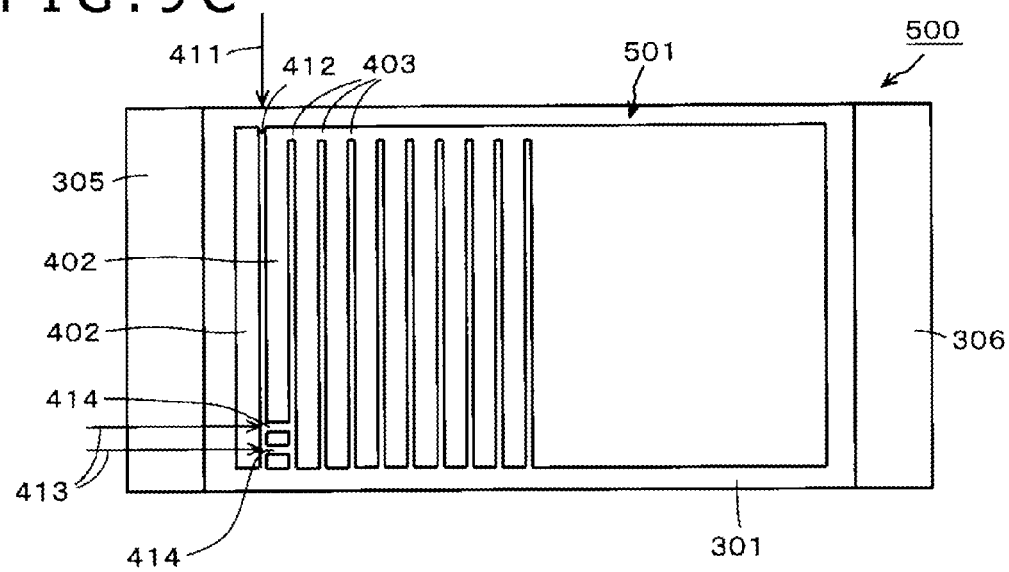

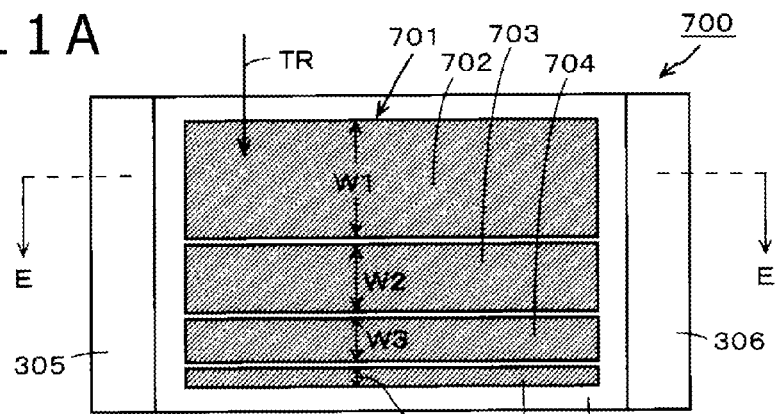
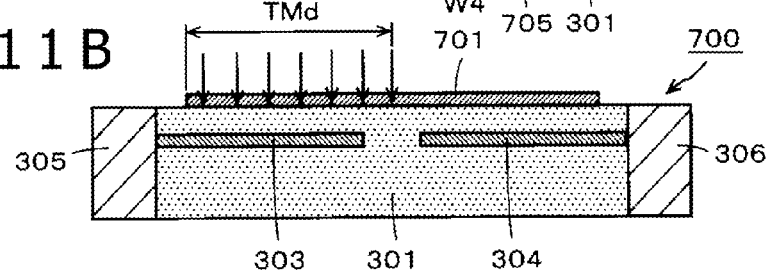
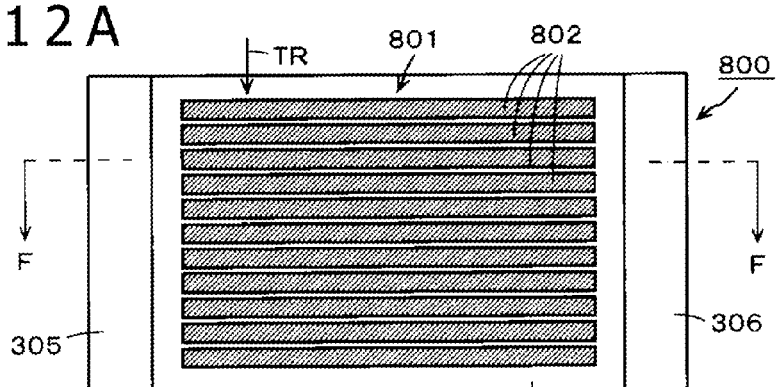
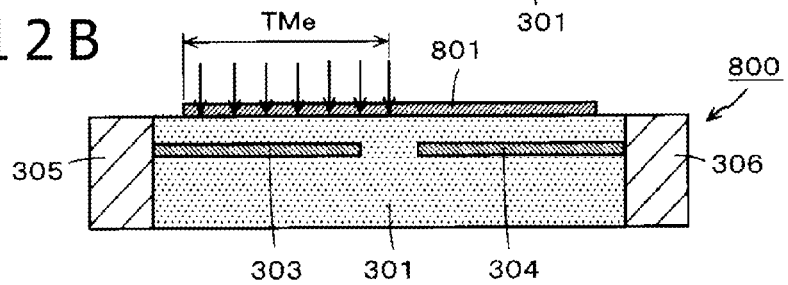

POSITION INDICATOR AND CAPACITOR

BACKGROUND

Technical Field

The present invention relates to a position indicator of an electromagnetic induction system and to a capacitor suitable for use as a capacitor forming a resonance circuit of the position indicator of the electromagnetic induction system.

Description of the Related Art

As disclosed in Patent Document 1 (Japanese Patent Laid-Open No. 2002-244806), for example, a coordinate input device of an electromagnetic induction system includes: a position detecting device having a sensor formed by disposing a large number of loop coils in an X-axis direction and a Y-axis direction of coordinate axes; and a pen-shaped position indicator having a resonance circuit including a coil wound around a magnetic core and a capacitor.

The position detecting device supplies a transmission signal of a predetermined frequency to a loop coil of the sensor. The loop coil transmits the transmission signal as electromagnetic energy to the position indicator. The resonance circuit of the position indicator is configured to have a resonance frequency according to the frequency of the transmission signal. The resonance circuit stores the electromagnetic energy on the basis of electromagnetic induction action between the resonance circuit and the loop coil of the sensor. Then, the position indicator returns the electromagnetic energy stored in the resonance circuit to a loop coil of the sensor of the position detecting device.

The loop coil of the sensor detects the electromagnetic energy from the position indicator. The position detecting device detects coordinate values in the X-axis direction and the Y-axis direction on the sensor, which coordinate values are indicated by the position indicator, on the basis of the position of the loop coil that supplied the transmission signal and the position of the loop coil that detected the electromagnetic energy from the resonance circuit of the position indicator.

FIG. 17 shows a general construction of an example of a pen-shaped position indicator 1 of the electromagnetic induction system in related art. The position indicator 1 in the example of FIG. 17 includes, within a hollow cylindrical casing 11, a ferrite core 13 as a magnetic core wound with a coil 12 forming a resonance circuit and a plurality of capacitors 14, 15, 16, and 17 for resonance, the capacitors 14, 15, 16, and 17 being connected in parallel with the coil 12. FIG. 17 is a sectional view of the position indicator 1, and shows the coil 12 in a state of being wound around the ferrite core 13 for purposes of illustration.

A projecting member (pen point member) 18 is joined to an end portion on a pen point side in an axial direction of the ferrite core 13. The projecting member 18 is provided so as to project from an opening 11a on the pen point side of the casing 11 to the outside. A printed board 19 is disposed and housed within the casing 11 on an opposite end portion side in the axial direction of the ferrite core 13, which opposite end portion side is opposite from the side of the projecting member 18. The capacitors 14, 15, 16, and 17 are attached on one surface of the printed board 19.

As will be described later, resonance frequency of a resonance circuit of the position indicator 1 needs to be adjusted to be a desired value. Therefore, the capacitors 14 and 15 are formed by a trimmer capacitor of variable capacitance, and the capacitors 16 and 17 are formed by a capacitor of fixed capacitance.

In addition, in the example of FIG. 17, a side switch 20 as a switch circuit is provided on the printed board 19. This side switch 20 is turned on and off by a user pressing a pressing portion exposed from a through hole (not shown) provided in the side surface of the casing 11 to the outside of the casing 11. The side switch 20 controls the turning on and off of the connection of a predetermined capacitor of a plurality of the capacitors 14, 15, 16, and 17 to the resonance circuit. Hence, the capacitance value of the capacitors forming the resonance circuit is changed by turning on and off the side switch 20, so that the phase (resonance frequency) of an electromagnetic wave transmitted from the coil 12 of the resonance circuit to a position detecting device changes.

The position detecting device can detect a position indicated by the position indicator 1 and an operation of the side switch 20 of the position indicator 1 by detecting a change in phase (frequency) of the electromagnetic wave from the position indicator 1, which electromagnetic wave is received by a loop coil. Incidentally, the operation of turning on and off the side switch 20, which operation is detected by the position detecting device, is assigned to various functions such as an operation-indicating (operation-confirming) input, for example, in an electronic device such as a personal computer in which the position detecting device is included or to which the position detecting device is externally connected.

The inductance value of the coil 12 wound around the ferrite core 13 varies from part to part. The resonance circuit of the position indicator 1 is therefore configured such that a desired resonance frequency can be obtained by adjusting the capacitance of the capacitors connected in parallel with the coil 12. In the case of the position indicator including the side switch 20 as described above, each of the resonance frequency when the side switch 20 is off and the resonance frequency when the side switch 20 is on also needs to be adjusted.

The capacitor 14 and the capacitor 15 are therefore formed by trimmer capacitors whose capacitance can be changed by operating capacitance adjusting knobs 14a and 15a, respectively. For example, the capacitor 14 is for adjustment of the resonance frequency of the resonance circuit when the side switch 20 is off, and the capacitor 15 is for adjustment of the resonance frequency of the resonance circuit when the side switch 20 is on.

The adjustment of the resonance frequency by the trimmer capacitors 14 and 15 is final fine adjustment of the resonance frequency of the resonance circuit of the position indicator 1, and is made in a state of the trimmer capacitors 14 and 15 having been incorporated in the casing 11 of the position indicator 1. For example, the capacitance of the trimmer capacitors 14 and 15 is changed by adjusting the capacitance adjusting knobs 14a and 15a of the trimmer capacitors 14 and 15 through the through hole bored in the side surface of the casing 11 to attach the side switch 20. The resonance frequency of the resonance circuit is thus adjusted.

BRIEF SUMMARY

As described above, in the position indicator in related art, the resonance frequency is adjusted to be a desired value by making fine adjustment of variation in the resonance frequency of the resonance circuit by the trimmer capacitors, which variation is caused by variation in the inductance value of the coil and variation in the capacitance value of the capacitors themselves.

However, the trimmer capacitors for the fine adjustment of the resonance frequency of the resonance circuit of the position indicator are electronic parts having a relatively large shape, and are costly parts.

In addition, progress has been made in miniaturization of electronic devices such as mobile telephone terminals, PDA (Personal Digital Assistant) terminals, and tablet terminals in recent years, and the ratios of spaces occupied by electronic circuits inside the electronic devices need to be decreased. Progress has been made in application of coordinate input devices of the above-described electromagnetic induction system as user interface means of small portable devices such as mobile telephone terminals and portable type personal computers. Position indicators used in conjunction with the coordinate input devices for such small electronic devices are desired to be of a thinner pen shape.

However, as described above, in the case of the position indicator in related art, the trimmer capacitors, which are electronic parts having a large shape, are used for the adjustment of the resonance frequency, and thus require a large mounting space, which has been a hindrance in forming the position indicator into a thin pen shape.

Further, in related art, an adjustment worker needs to make adjustment by turning the adjusting knobs of the trimmer capacitors. Thus, adjustment work takes time, and it is difficult to automate an adjustment process. The presence of the trimmer capacitors has therefore been an obstacle to mass production of the position indicator.

According to one aspect, the present invention provides a position indicator of the electromagnetic induction system and a capacitor having an adjustable capacitance value that can avoid problems as described above.

In order to solve the above-described problems, one embodiment of the invention provides a position indicator having a resonance circuit housed in a casing, wherein the resonance circuit includes an inductance element and a capacitor variable in capacitance and resonates at a predetermined frequency. The position indicator is electromagnetically coupled to a position detecting device. The capacitor forming the resonance circuit includes a dielectric, an electrode disposed on one side of the dielectric, and a trimming electrode disposed on another side of the dielectric such that at least one part of a region of the trimming electrode is opposed to the electrode with the dielectric interposed in between, to form the capacitance of the capacitor. The capacitor is housed in the casing such that the at least one part of the region of the trimming electrode can be exposed from the casing. The area of the at least one part of the region forming the trimming electrode, which is exposable from the casing to the outside, is changed so as to correspond to a resonance frequency desired for the resonance circuit.

Another embodiments of the invention provides a capacitor including a dielectric, an electrode disposed on one side of the dielectric, and a trimming electrode disposed on another side of the dielectric such that at least one part of a region of the trimming electrode is opposed to the electrode with the dielectric interposed in between, to form a capacitance of the capacitor. The electrode disposed on said one side of the dielectric includes a first electrode and a second electrode respectively connected to external electrodes of the capacitor. The trimming electrode includes regions disposed so as to be opposed to the first electrode and the second electrode, respectively, with the dielectric interposed in between. Trimming is performed by electrically separating the trimming electrode from at least one electrode of the external electrodes.

The position indicator according to various embodiments of the invention uses a capacitance adjusting capacitor having the trimming electrode exposable to the outside, as a capacitor for adjusting the resonance frequency of the resonance circuit, in place of a trimmer capacitor whose capacitance is adjusted by turning an adjusting knob as in related art.

In the capacitance adjusting capacitor, the trimming electrode disposed on one side of the dielectric is trimmed by being irradiated with a laser beam, for example, whereby an effective area of the trimming electrode opposed to the electrode disposed on the other side of the dielectric is changed. Thus, the capacitance of the capacitance adjusting capacitor can be changed. In the position indicator according to the present invention, the trimming electrode of the capacitance adjusting capacitor is trimmed so as to make the resonance frequency of the resonance circuit including the capacitance adjusting capacitor a desired frequency, while the capacitance adjusting capacitor is mounted on a board within the casing. After the adjustment of the resonance frequency, a trimming processing trace is left in the trimming electrode of the capacitance adjusting capacitor.

The capacitance adjusting capacitor can be formed as a minute chip capacitor, and can thus be of a small size. Therefore the position indicator can be made smaller and thinner. In addition, the capacitance adjusting capacitor is suitable for mass production and can be reduced in price, and thus contributes to reduction in price of the position indicator. The capacitance of the capacitance adjusting capacitor can be varied by trimming processing applied to the capacitance adjusting capacitor with a laser beam or the like. Thus, adjustment work can be made easier than in the case where trimmer capacitors are adjusted, and an adjustment process can be automated, so that the mass production of the position indicator is made possible.

According to the present invention, the use of the capacitance adjusting capacitor having the trimming electrode formed in a state of being exposed to the outside as a capacitor for adjusting the resonance frequency of the resonance circuit of the position indicator enables miniaturization, price reduction, facilitation of the adjustment work, and automation of the adjustment process, and can therefore solve the problems of the above-described position indicator in related art.

BRIEF DESCRIPTION OF THE SEVERAL VIEWS OF THE DRAWINGS

FIGS. 3A and 3B are diagrams of assistance in explaining a first example of construction of a capacitance adjusting capacitor used in the embodiment of the position indicator according to the present invention;

FIG. 4 is a diagram of assistance in explaining the first example of construction of the capacitance adjusting capacitor used in the embodiment of the position indicator according to the present invention;

FIGS. 6A and 6B are diagrams of assistance in explaining an example of trimming of a trimming electrode of the capacitance adjusting capacitor used in the embodiment of the position indicator according to the present invention;

FIGS. 7A and 7B are diagrams of assistance in explaining an example of a method for trimming the trimming electrode of the capacitance adjusting capacitor used in the embodiment of the position indicator according to the present invention;

FIGS. 9A, 9B, and 9C are diagrams of assistance in explaining a third example of construction of the capacitance adjusting capacitor used in the embodiment of the position indicator according to the present invention and an example of trimming of a trimming electrode in the third construction example;

FIGS. 11A and 11B are diagrams of assistance in explaining a fifth example of construction of the capacitance adjusting capacitor used in the embodiment of the position indicator according to the present invention and an example of trimming of a trimming electrode in the fifth construction example;

FIGS. 12A and 12B are diagrams of assistance in explaining a sixth example of construction of the capacitance adjusting capacitor used in the embodiment of the position indicator according to the present invention and an example of trimming of a trimming electrode in the sixth construction example;

DETAILED DESCRIPTION

Figure 1A:
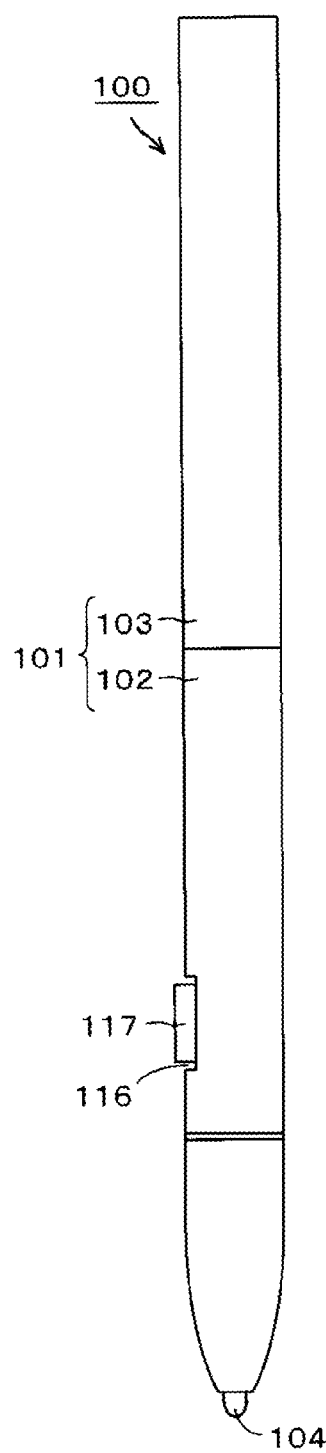
FIGS. 1A and 1B are diagrams showing an outline of an embodiment of a position indicator according to the present invention.

A position indicator according to the present invention has the following features.

(1) The position indicator having a resonance circuit housed in a casing, the resonance circuit including an inductance element and a capacitor variable in capacitance and the resonance circuit resonating at a predetermined frequency, the position indicator being electromagnetically coupled to a position detecting device, wherein the capacitor forming the resonance circuit includes a dielectric, an electrode disposed on one side of the dielectric, and a trimming electrode disposed on another side of the dielectric such that at least one part of a region of the trimming electrode is opposed to the electrode with the dielectric interposed in between, to form the capacitance of the capacitor, the capacitor is housed in the casing such that the at least one part of the region of the trimming electrode is exposable from the casing, and the area of the at least one part of the region forming the trimming electrode, which is exposable from the casing to the outside, is changed so as to correspond to a resonance frequency desired for the resonance circuit.

(2) In the above feature (1), the electrode disposed on said one side of the dielectric includes a first electrode and a second electrode, and the trimming electrode includes regions disposed so as to be opposed to the first electrode and the second electrode, respectively, with the dielectric interposed in between.

(3) In the above feature (2), the first electrode and the second electrode are respectively connected to external electrodes of the capacitor.

(4) In the above feature (3), trimming has been performed for electrically separating the trimming electrode from at least one electrode of the external electrodes.

(5) In the above feature (1), the trimming electrode has a construction formed by coupling each of a plurality of capacitance forming region portions with a coupling portion, and the capacitance of the capacitor can be changed by severing the coupling portion.

(6) In the above feature (5), the plurality of capacitance forming region portions are disposed so as to be opposed to a portion of the electrode.

(7) In the above feature (2), the at least one part of the region forming the trimming electrode is disposed so as to be opposed to at least one electrode of the first electrode and the second electrode with the dielectric interposed in between.

(8) In the above feature (2), the first electrode and the second electrode are respectively housed in the dielectric so as to be disposed at positions equidistant from the trimming electrode.

(9) In the above feature (1), the electrode disposed on said one side of the dielectric is disposed within the dielectric so as to be opposed to the trimming electrode.

(10) In the above feature (1), each of the electrode disposed on said one side of the dielectric and the trimming electrode is connected to an external electrode of the capacitor.

(11) In the above feature (1), the trimming electrode has a construction formed by coupling each of a plurality of capacitance forming region portions with a coupling portion, and the capacitance of the capacitor can be changed by changing the area of at least one capacitance forming region portion of the plurality of capacitance forming region portions coupled with the coupling portion.

(12) In the above feature (1), the trimming electrode includes a plurality of capacitance forming region portions separated from each other, and the capacitance of the capacitor can be changed by changing the area of at least one capacitance forming region portion of the plurality of capacitance forming region portions.

(13) In the above feature (12), the plurality of capacitance forming region portions include capacitance forming region portions having areas different from each other.

(14) In the above feature (1), a user-operable element is to be disposed in a side surface of the casing, and the at least one part of the region of the trimming electrode is located in a vicinity of a position of the user-operable element, whereby the capacitor is housed in the casing such that the at least one part of the region of the trimming electrode is exposable from the casing when the user-operable element is not disposed.

(15) In the above feature (1), the casing is formed by at least two members, and the capacitor is housed in the casing such that the at least one part of the region of the trimming electrode is exposable from the casing when one member is not mounted on the other member.

(16) In the above feature (1), the area of the at least one part of the region forming the trimming electrode is changed so as to correspond to the resonance frequency desired for the resonance circuit by severing the area of the at least one part of the region of the trimming electrode into the area contributing to the capacitance of the capacitor and the area not contributing to the capacitance.

(17) In the above feature (16), the severing of the area of the at least one part of the region of the trimming electrode into the area contributing to the capacitance of the capacitor and the area not contributing to the capacitance is performed optically or mechanically.

(18) In the above feature (1), the trimming electrode is formed of a material including carbon.

(19) In the above feature (1), the trimming electrode disposed on the another side of the dielectric is disposed uniformly on the another side.

A capacitor according to the present invention has the following features.

(20) The capacitor includes a dielectric, an electrode disposed on one side of the dielectric, and a trimming electrode disposed on another side of the dielectric such that at least one part of a region of the trimming electrode is opposed to the electrode with the dielectric interposed in between, to form a capacitance of the capacitor, wherein the electrode disposed on said one side of the dielectric includes a first electrode and a second electrode respectively connected to external electrodes of the capacitor, the trimming electrode includes regions disposed so as to be opposed to the first electrode and the second electrode, respectively, with the dielectric interposed in between, and trimming has been performed for electrically separating the trimming electrode from at least one electrode of the external electrodes.

An embodiment of a position indicator according to the present invention having the above-described features and an embodiment of a variable capacitance type capacitor according to the present invention will hereinafter be described with reference to the drawings. Incidentally, the embodiment of the variable capacitance type capacitor according to the present invention will be described by taking a case where the variable capacitance type capacitor is a capacitance adjusting capacitor used in a position indicator according to the present invention.

Figure 1B:
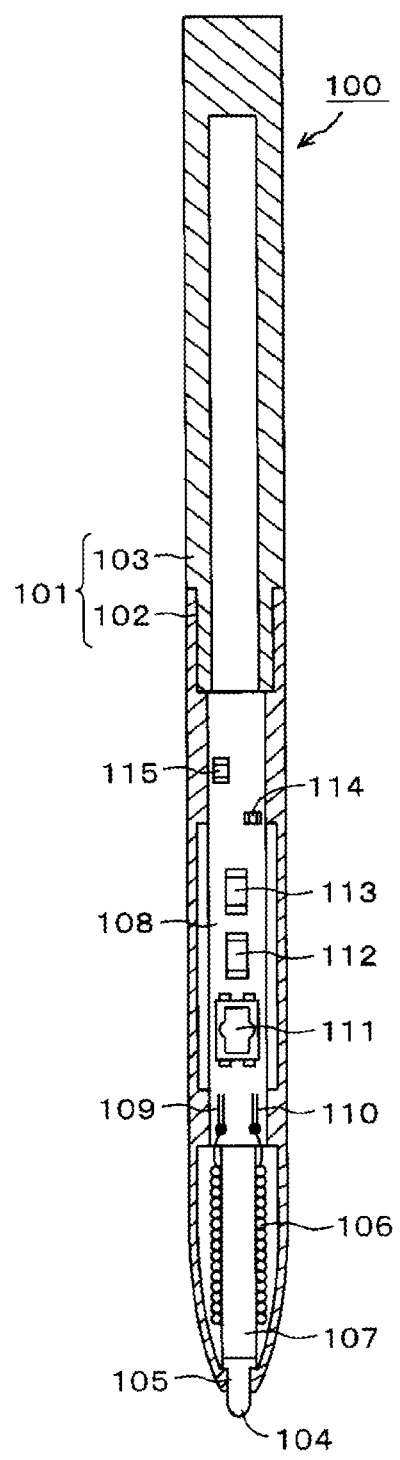
Figure 2:
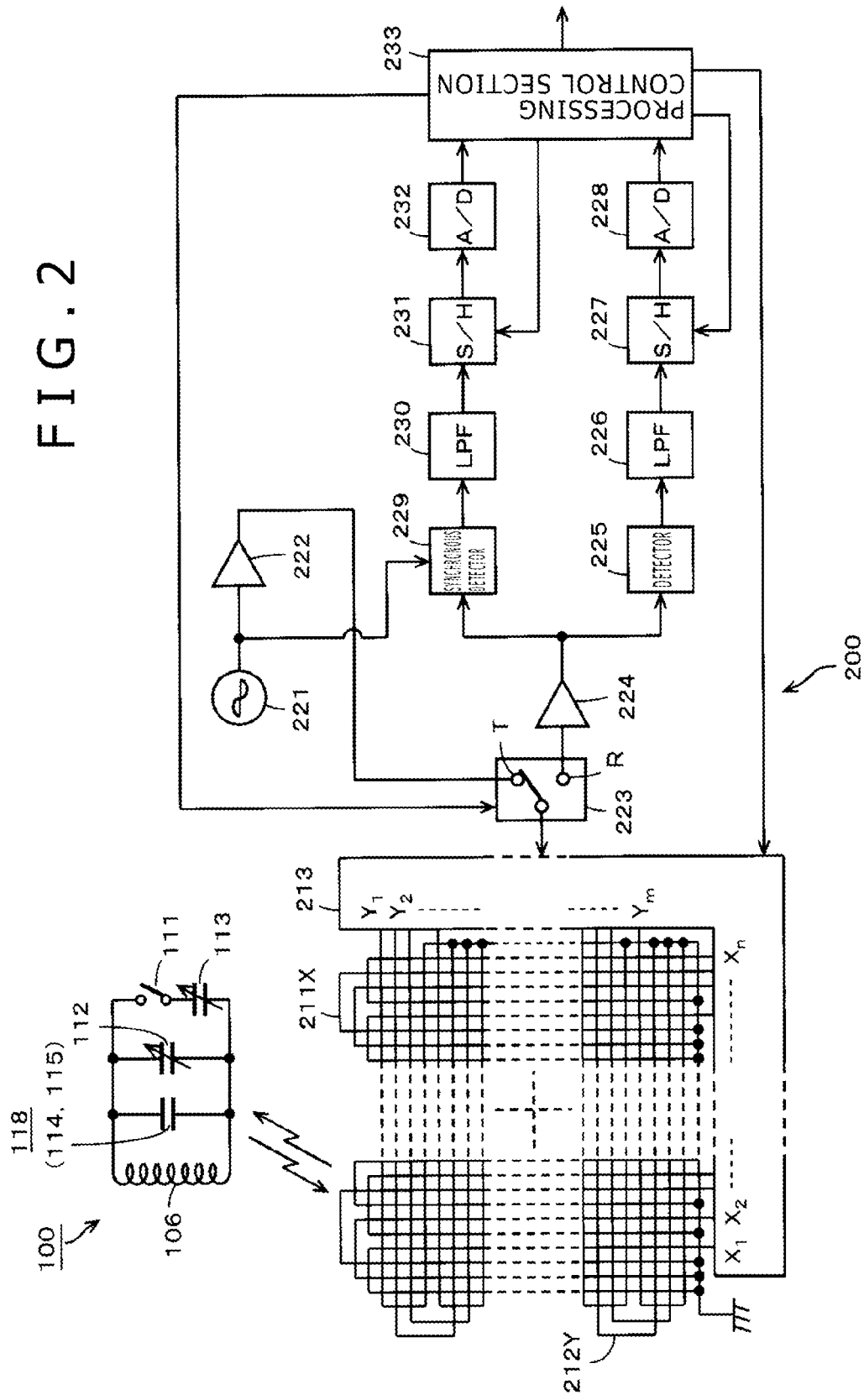
FIG. 2 is a circuit diagram showing a circuit configuration of the embodiment of the position indicator according to the present invention and an example of circuit configuration of a position detecting device used in conjunction with the position indicator.

FIG. 1A shows an outline of the whole of a position indicator 100 according to the present embodiment. FIG. 1B is a longitudinal sectional view of the position indicator 100 according to the present embodiment. FIG. 2 is a diagram showing a circuit configuration of the position indicator 100 according to the first embodiment and a position detecting device 200 of an electromagnetic induction system, the position detecting device 200 being used in conjunction with the position indicator 100.

As shown in FIGS. 1A and 1B, the position indicator 100 has a case 101 forming a bottomed cylindrical casing elongated in an axial direction and closed on one side. As shown in FIG. 1B, the case 101 includes a first case 102 and a second case 103 formed of a resin, for example. The first case 102 and the second case 103 are concentrically combined with each other. In this case, as shown in FIG. 1B, the first case 102 and the second case 103 are assembled and coupled to each other such that the second case 103 is on the inside of the first case 102.

One end side in the axial direction of the first case 102 is a pen point side of the position indicator in the shape of a pen. A through hole 105 for projecting a projecting member (pen point member) 104 to the outside is provided on the pen point side of the first case 102.

On the pen point side within the first case 102 of the case 101 of the position indicator 100, as shown in FIG. 1B, the projecting member 104 is housed in a state in which part of the projecting member 104 is projected to the outside through the through hole 105. A ferrite core 107 as an example of a magnetic material wound with a coil 106 as an example of an inductance element is disposed on an opposite side of the projecting member 104 from the projecting side. The ferrite core 107 has a cylindrical shape, for example.

An elongated rectangular printed board 108 having a smaller width than the inside diameter of the first case 102 is disposed on an opposite side of the ferrite core 107 wound with the coil 106 from the pen point side within the first case 102. One end and another end of the coil 106 are for example soldered to conductive patterns 109 and 110 formed on the printed board 108.

The printed board 108 is provided with a side switch 111, and is provided with capacitance adjusting capacitors 112 and 113 and chip capacitors 114 and 115 forming a resonance circuit in conjunction with the coil 106. The side switch 111 is formed by a self-return type switch that is turned on when depressed and that returns to an off state when the depression is not applied.

Further, a conductor pattern not shown in the figures is formed on the printed board 108 to form a resonance circuit 118 for electromagnetic coupling to the position detecting device 200 by the action of electromagnetic induction. Specifically, in the present example, as shown in FIG. 2, the resonance circuit 118 has the chip capacitors 114 and 115 and the capacitance adjusting capacitor 112 that are connected in parallel with the position indicating coil 106, and has a series circuit of the capacitance adjusting capacitor 113 and the side switch 111 which series circuit is connected in parallel with the position indicating coil 106.

In the present example, a through hole 116 is bored at a position corresponding to the side switch 111 in the side circumferential surface of the case 101 (first case 102) of the position indicator 100. A depression operating element 117 is attached to the inside of the case 101 so as to be able to depress the side switch 111 through the through hole 116. In this case, a predetermined function is assigned and set to the operation of depressing the side switch 111 by the depression operating element 117 on the side of an electronic device having the position detecting device 200. For example, the electronic device having the position detecting device 200 assigns and sets the operation of depressing the side switch 111 by the depression operating element 117 as an operation similar to a click operation on a pointing device such as a mouse.

Incidentally, the printed board 108 is formed so as to be retained by the inner wall surface of the first case 102. An opposite side of the printed board 108 from the pen point side within the first case 102 is a hollow space.

[Example of Circuit Configuration of Position Detecting Device 200]

An example of circuit configuration of the position detecting device 200, which detects a position indicated by the position indicator 100 according to the above-described embodiment and which detects the on/off state of the side switch 111, will next be described with reference to FIG. 2.

The position indicator 100 includes the resonance circuit 118 of the above-described circuit configuration. In this case, the connection of the capacitance adjusting capacitor 113 to the parallel resonance circuit 118 is controlled to change resonance frequency according to the on/off state of the side switch 111. As will be described later, the position detecting device 200 detects whether or not the side switch 111 is pressed by detecting a change in phase (or a change in frequency) of a signal from the position indicator 100.

The position detecting device 200 has a position detecting coil formed by stacking an X-axis direction loop coil group 211X and a Y-axis direction loop coil group 212Y. The loop coil groups 211X and 212Y are for example formed by n rectangular loop coils and m rectangular loop coils, respectively. The loop coils forming the loop coil groups 211X and 211Y are disposed so as to be arranged at equal intervals and sequentially overlap each other.

In addition, the position detecting device 200 has a selecting circuit 213 connected with the X-axis direction loop coil group 211X and the Y-axis direction loop coil group 212Y. The selecting circuit 213 sequentially selects one loop coil of the two loop coil groups 211X and 212Y.

The position detecting device 200 further includes an oscillator 221, a current driver 222, a switching connecting circuit 223, a receiving amplifier 224, a detector 225, a low-pass filter 226, a sample and hold circuit 227, an A/D (Analog to Digital) converter circuit 228, a synchronous detector 229, a low-pass filter 230, a sample and hold circuit 231, an A/D converter circuit 232, and a processing control section 233. The processing control section 233 is formed by a microcomputer.

The oscillator 221 generates an alternating-current signal of a frequency f0. The oscillator 221 then supplies the generated alternating-current signal to the current driver 222 and the synchronous detector 229. The current driver 222 converts the alternating-current signal supplied from the oscillator 221 into a current, and sends out the current to the switching connecting circuit 223. The switching connecting circuit 223 selects a connection destination (a transmitting side terminal T or a receiving side terminal R) to which to connect the loop coil selected by the selecting circuit 213, under control of the processing control section 233. Of the connection destinations, the transmitting side terminal T is connected with the current driver 222, and the receiving side terminal R is connected with the receiving amplifier 224.

An induced voltage generated in the loop coil selected by the selecting circuit 213 is sent to the receiving amplifier 224 via the selecting circuit 213 and the switching connecting circuit 223. The receiving amplifier 224 amplifies the induced voltage supplied from the loop coil, and sends out the amplified induced voltage to the detector 225 and the synchronous detector 229.

The detector 225 detects the induced voltage generated in the loop coil, that is, a received signal, and sends out the received signal to the low-pass filter 226. The low-pass filter 226 has a cutoff frequency sufficiently lower than the above-mentioned frequency f0. The low-pass filter 226 converts the output signal of the detector 225 into a direct-current signal, and sends out the direct-current signal to the sample and hold circuit 227. The sample and hold circuit 227 holds a voltage value of the output signal of the low-pass filter 226 in predetermined timing, specifically predetermined timing during a receiving period, and sends out the voltage value to the A/D converter circuit 228. The A/D converter circuit 228 converts the analog output of the sample and hold circuit 227 into a digital signal, and outputs the digital signal to the processing control section 233.

Meanwhile, the synchronous detector 229 performs synchronous detection of the output signal of the receiving amplifier 224 with the alternating-current signal from the oscillator 221, and sends out a signal having a level corresponding to a phase difference between the output signal of the receiving amplifier 224 and the alternating-current signal from the oscillator 221 to the low-pass filter 230. The low-pass filter 230 has a cutoff frequency sufficiently lower than the frequency f0. The low-pass filter 230 converts the output signal of the synchronous detector 229 into a direct-current signal, and sends out the direct-current signal to the sample and hold circuit 231. The sample and hold circuit 231 holds a voltage value of the output signal of the low-pass filter 230 in predetermined timing, and sends out the voltage value to the A/D converter circuit 232. The A/D converter circuit 232 converts the analog output of the sample and hold circuit 231 into a digital signal, and outputs the digital signal to the processing control section 233.

The processing control section 233 controls various parts of the position detecting device 200. Specifically, the processing control section 233 controls the selection of a loop coil in the selecting circuit 213, the switching of the switching connecting circuit 223, and the timing of the sample and hold circuits 227 and 231. The processing control section 233 controls the X-axis direction loop coil group 211X and the Y-axis direction loop coil group 212Y to transmit a radio wave for a certain transmission duration on the basis of the input signals from the A/D converter circuits 228 and 232.

A radio wave transmitted from the position indicator 100 generates an induced voltage in each of loop coils of the X-axis direction loop coil group 211X and the Y-axis direction loop coil group 212Y. The processing control section 233 calculates the coordinate values of an indicated position in the X-axis direction and the Y-axis direction, which position is indicated by the position indicator 100, on the basis of the level of the voltage value of the induced voltage generated in each of the loop coils. In addition, the processing control section 233 detects whether the side switch 111 is depressed or not on the basis of the level of a signal corresponding to a phase difference between the transmitted radio wave and the received radio wave.

Thus, in the position detecting device 200, the processing control section 233 can detect the position of the position indicator 100 that has approached the position detecting device 200. In addition, the processing control section 233 can detect whether or not the depression operating element 117 is depressed in the position indicator 100, by detecting the phase (frequency shift) of the received signal.

[Construction of Capacitance Adjusting Capacitor and Adjustment of Resonance Frequency of Resonance Circuit of Position Indicator 100]

As described above, the inductance value of the coil 106 wound around the ferrite core 107 varies from part to part. The resonance circuit 118 of the position indicator 100 according to the present embodiment is therefore configured such that a desired resonance frequency can be obtained by changing the capacitance of the capacitance adjusting capacitors 112 and 113 connected in parallel with the coil 106. In the present embodiment, the resonance frequency when the side switch 111 is off is adjusted by changing the capacitance of the capacitance adjusting capacitor 112, and the resonance frequency when the side switch 111 is on is adjusted by changing the capacitance of the capacitance adjusting capacitor 113.

The capacitance adjusting capacitors 112 and 113 in the present example have the construction of a small chip capacitor. As will be described later, a trimming electrode that can be trimmed by a laser beam is formed on exposed upper surfaces of the capacitance adjusting capacitors 112 and 113. The capacitance adjusting capacitors 112 and 113 are disposed on the printed board 108 such that the trimming electrodes on the exposed upper surfaces of the capacitance adjusting capacitors 112 and 113 can be trimmed in a state of the printed board 108 being housed within the case 101.

In the present embodiment, the laser beam is configured to be able to be incident on and trim the trimming electrodes on the exposed upper surfaces of the capacitance adjusting capacitors 112 and 113 disposed on the printed board 108 through the through hole 116 as an opening for disposing the depression operating element 117 for the side switch 111. Incidentally, the trimming electrodes are trimmed by scanning the laser beam along the axial direction of the position indicator 100. In other words, the trimming electrodes of the capacitance adjusting capacitors 112 and 113 disposed on the printed board 108 housed in the case 101 are formed such that the scanning direction of the laser beam is the axial direction of the position indicator 100. The scanning direction of the laser beam can also be made orthogonal to the axial direction of the position indicator 100. When the scanning direction of the laser beam is made to be such a direction, the trimming direction of the trimming electrodes can be defined by positioning the position indicator 100. This facilitates simplification of the work of adjusting the capacitance of the capacitance adjusting capacitors and automation of a capacitance adjusting process.

In this case, in the capacitance adjusting process, an imaging device takes an image of (photographs) the trimming electrodes of the capacitance adjusting capacitors through the opening for irradiating the trimming electrodes of the capacitance adjusting capacitors with the laser beam. Then, for example the positions of four corners of the trimming electrodes are detected using the photographed image, and the position indicator is aligned on the basis of the detected positions such that the scanning direction of the laser beam with respect to the trimming electrodes is set in a desired direction.

Further, when the position indicator is set in an automatic machine, the position indicator also needs to be positioned in a direction of rotation about the axial position of the position indicator such that the exposed surfaces of the trimming electrodes of the capacitance adjusting capacitors are orthogonal to the direction of incidence of the laser beam. The positioning of the position indicator in the direction of rotation can be performed on the basis of an amount of received light of reflected light when the laser beam is made incident on the exposed surfaces of the trimming electrodes of the capacitance adjusting capacitors.

In order to perform such alignment in the direction of rotation about the axial position of the position indicator for a proper direction of incidence of the laser beam, the trimming electrodes of the capacitance adjusting capacitors are desirably formed so as to be flat or like a flat shape and reflect light.

The trimming processing with the laser beam as described above changes the capacitance of the capacitance adjusting capacitors 112 and 113 to adjust the resonance frequency of the resonance circuit 118 of the position indicator 100. The capacitance adjusting capacitor 112 and the capacitance adjusting capacitor 113 have the same construction. A few examples of construction of the capacitance adjusting capacitors 112 and 113 will be described in the following.

<First Example of Construction of Capacitance Adjusting Capacitors 112 and 113>

FIGS. 3A and 3B are diagrams showing a chip capacitor 300 in a first example of construction of the capacitance adjusting capacitors 112 and 113. FIG. 3A is a top view of the chip capacitor 300. FIG. 3B is a sectional view taken along a line A-A of FIG. 3A.

In the chip capacitor 300 in the first construction example, a trimming electrode 302 is formed uniformly on the upper surface of a rectangular thin dielectric 301, for example, and two internal electrodes 303 and 304 (a first electrode and a second electrode) opposed to the trimming electrode 302 with part of the dielectric 301 interposed in between are provided inside the dielectric 301.

The internal electrodes 303 and 304 have rectangular shapes with the same area in the present example. The internal electrodes 303 and 304 are separated from each other within the dielectric 301, and one internal electrode 303 is partly exposed in one side surface portion (left side surface portion) of the dielectric 301, while the other internal electrode 304 is partly exposed in another side surface portion (right side surface portion) of the dielectric 301. In the left side surface portion of the dielectric 301 in which portion the internal electrode 303 is partly exposed, one external electrode 305 of the chip capacitor 300 is electrically connected to the internal electrode 303. In addition, in the right side surface portion of the dielectric 301 in which portion the internal electrode 304 is partly exposed, another external electrode 306 of the chip capacitor 300 is electrically connected to the internal electrode 304. The external electrodes 305 and 306 are used as connecting terminals for electric connection to the conductor pattern formed on the printed board.

The dielectric 301 is formed of ceramic, for example. The trimming electrode 302 in the present example is formed of carbon (pure carbon). Incidentally, the trimming electrode 302 may be formed of a mixture of carbon and silver (Ag) rather than pure carbon. The internal electrodes 303 and 304 are formed of a conductive metal such as nickel (Ni), copper (Cu), silver-palladium (Ag—Pd), or palladium (Pd), for example. The first and second external electrodes 305 and 306 are also formed of a conductive metal such as nickel (Ni), copper (Cu), silver-palladium (Ag—Pd), or palladium (Pd), for example.

Main constituent parts of the chip capacitor 300 excluding the external electrodes 305 and 306 can be produced by using a plurality of dielectric ceramic sheets, as shown in FIG. 4, for example. Specifically, as shown in FIG. 4, the trimming electrode 302 is formed uniformly all over one surface of a rectangular dielectric ceramic sheet 301a having a thickness equal to a distance between the trimming electrode 302 and the internal electrodes 303 and 304, that is, the trimming electrode 302 is formed solidly on one surface of the dielectric ceramic sheet 301a, by deposition, coating, or evaporation by a printing method, a spray coating method, a sputtering method, or the like.

In this case, it suffices to form the trimming electrode 302 solidly on one surface of the dielectric ceramic sheet 301a by deposition, coating, or evaporation. The trimming electrode 302 is thus formed on the dielectric ceramic sheet 301a very easily.

In addition, the internal electrode 303 and the internal electrode 304 that are rectangular and have the same size in the present example are formed on a left region and a right region, respectively, on one surface of a rectangular dielectric ceramic sheet 301b, using a conductive paste made of the aforementioned conductive metal by a method such as printing or sputtering. At this time, the internal electrode 303 is formed so as to extend to the left side end portion of the rectangular dielectric ceramic sheet 301b, and the internal electrode 304 is formed so as to extend to the right side end portion of the rectangular dielectric ceramic sheet 301b.

Then, the dielectric ceramic sheet 301a on which the trimming electrode 302 is formed and the dielectric ceramic sheet 301b on which the internal electrodes 303 and 304 are formed are bonded to each other in a state of the trimming electrode 302 being opposed to the internal electrodes 303 and 304 with the dielectric interposed in between. Further, a protective dielectric ceramic sheet 301c is bonded to an opposite side of the dielectric ceramic sheet 301b, on which the internal electrodes 303 and 304 are formed, from the surface bonded to the dielectric ceramic sheet 301a on which the trimming electrode 302 is formed. Incidentally, the protective dielectric ceramic sheet 301c is provided to ensure a resistance to external force applied to the chip capacitor 300, and can be omitted.

The main constituent parts of the chip capacitor 300 excluding the external electrodes 305 and 306 are formed as described above. Then, the external electrodes 305 and 306 are formed by a sputtering method or a coating method on the left and right side surface portions of the main constituent parts, in which portions the trimming electrode 302 and the internal electrodes 303 and 304 are formed. Thus, the internal electrode 303 is electrically connected to the external electrode 305, and the internal electrode 304 is electrically connected to the external electrode 306.

A length Ly in a vertical direction and a length Lx in a horizontal direction (see FIG. 3A) of the upper surface of the chip capacitor 300 in the present example are for example Ly=0.8 mm and Lx=1.6 mm, and the thickness of the chip capacitor 300 is equal to or less than 0.5 mm. The chip capacitor 300 is thus very small.

Incidentally, in the present example, the trimming electrode 302 is formed solidly on the upper surface of the dielectric 301. Therefore the trimming electrode 302 is electrically connected to the external electrodes 305 and 306. In addition, in the present example, no protective film is formed on the trimming electrode 302, so that the trimming electrode 302 is exposed.

The capacitance of the chip capacitor 300 can be changed by trimming the trimming electrode 302 with a laser beam in the present example. The trimming processing in the present example irradiates the trimming electrode 302 made of carbon with a laser beam and thereby burns and removes an irradiated portion of the trimming electrode 302. In the trimming processing in the present embodiment, the portion irradiated with the laser beam disappears as $CO_2$ due to the burning of the trimming electrode 302 made of carbon. No residue is left after the burning in the trimming electrode 302 made of carbon, and the dielectric 301 is exposed as a trace of the trimming processing.

The trimming processing in the present example scans the laser beam on the trimming electrode 302 in the vertical direction (direction orthogonal to the opposing direction of the external electrode 305 and the external electrode 306) of the chip capacitor 300, as indicated by an arrow TR in FIG. 3A. The capacitance of the chip capacitor 300 is varied by changing the scanning position (trimming position) of the laser beam in the trimming electrode 302 along a direction (opposing direction of the external electrode 305 and the external electrode 306) orthogonal to the scanning direction of the laser beam indicated by the arrow TR.

Incidentally, in the chip capacitor 300, as described above, the trimming electrode 302 is electrically connected to the external electrodes 305 and 306. Therefore, trimming processing is first performed by irradiating two positions indicated by arrows in FIG. 5A with a laser beam. The trimming processing at this time will hereinafter be referred to as preliminary trimming processing.

Figure 5A:
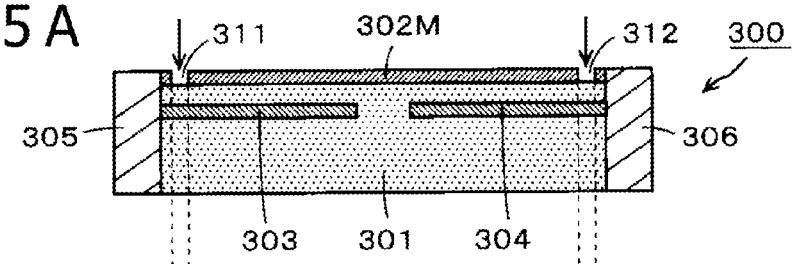
FIGS. 5A, 5B, 5C, and 5D are diagrams of assistance in explaining the first example of construction of the capacitance adjusting capacitor used in the embodiment of the position indicator according to the present invention.
Figure 5B:
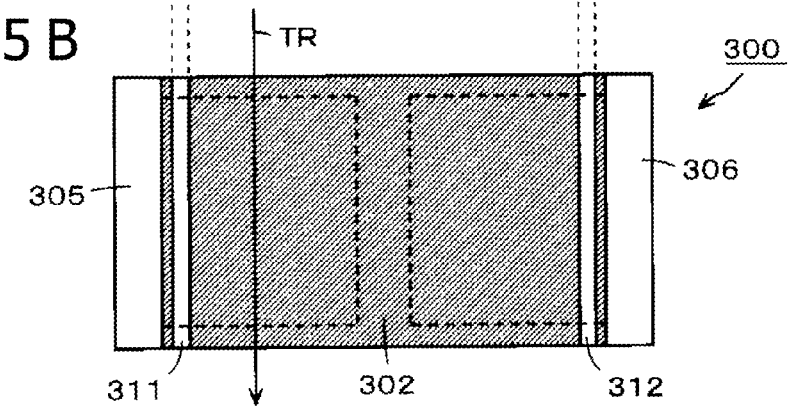

As shown in FIG. 5A, a portion irradiated with the laser beam in the trimming electrode 302 in the preliminary trimming processing is burned and disappears. As shown in FIGS. 5A and 5B, processing traces 311 and 312 in which the dielectric 301 is exposed are left in the trimming electrode 302. The processing traces 311 and 312 created by the preliminary trimming processing electrically separate the trimming electrode 302 from each of the external electrodes 305 and 306. In the present example, as shown in FIGS. 5A to 5C, the processing traces 311 and 312 are formed in the vicinities of the external electrodes 305 and 306 and at positions such that a distance from the external electrode 305 to the processing trace 311 is equal to a distance from the external electrode 306 to the processing trace 312.

As described above, as a result of the preliminary trimming processing with the laser beam, the processing traces 311 and 312 are formed, and thus the trimming electrode 302 is electrically separated from each of the external electrodes 305 and 306. As shown in FIG. 5D, a series connection circuit of two capacitors C1 and C2 is formed by regions where a trimming electrode 302M formed in the trimming electrode 302 so as to be electrically independent of the external electrodes 305 and 306 due to the two processing traces 311 and 312 is opposed to the internal electrodes 303 and 304, respectively. A capacitance formed by the series connection of the two capacitors C1 and C2 is an initial capacitance of the chip capacitor 300. Here, the capacitance of the capacitor C1 is formed on the basis of the opposing area of the internal electrode 303 and the trimming electrode 302M, and the capacitance of the capacitor C2 is formed on the basis of the opposing area of the internal electrode 304 and the trimming electrode 302M.

Figure 5C:
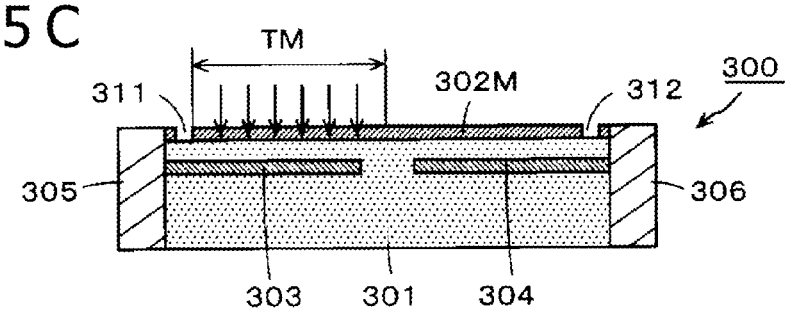
Figure 5D:
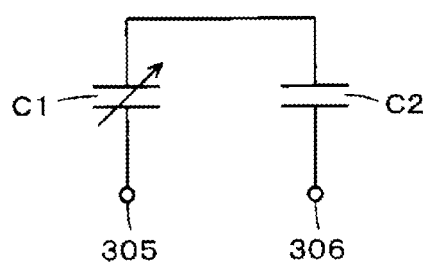

As shown in FIGS. 5B and 5C, the trimming electrode 302M is trimmed by a laser beam in the scanning direction indicated by an arrow TR (see FIG. 5B) to change the capacitance of the chip capacitor 300. In this trimming processing, the area of the trimming electrode 302M may be reduced by removing the trimming electrode 302M gradually inward from an end portion on the side of the external electrode 305, for example. However, this takes a considerable time to obtain a desired capacitance, and lengthens the irradiation time of the laser beam.

In order to avoid this, in the present example, the trimming electrode 302M is severed by scanning at a predetermined scanning position Ps in the trimming electrode 302M, which scanning position is determined between the external electrodes 305 and 306, with the laser beam, and scanning the laser beam in the direction orthogonal to the opposing direction of the external electrode 305 and the external electrode 306, as shown in FIGS. 6A and 6B. Then, capacitance is changed by sequentially changing the scanning position at which the trimming electrode 302M is severed by the laser beam gradually inward from the end portion on the side of the external electrode 305 so as to obtain a desired capacitance, and severing the trimming electrode 302M stepwise a necessary number of times. In this case, as shown in FIGS. 6A and 6B, a processing trace 313 in which the dielectric 301 is exposed is generated at the scanning position Ps of the trimming electrode 302M trimmed by the laser beam. In addition, in some cases, to make the capacitance a desired value, a plurality of processing traces may be formed in the trimming electrode 302M in the vicinity of the external electrode 305 or the external electrode 306.

A surface opposed to at least one internal electrode of the internal electrodes 303 and 304 is formed in the trimming electrode 302M, whereby the chip capacitor 300 exhibits a capacitance. In addition, when the trimming electrode 302M is severed by performing trimming processing by scanning the laser beam on a central portion of the trimming electrode 302M, which central portion is opposed to a gap portion formed in a portion where the internal electrode 303 and the internal electrode 304 are opposed to each other, in the direction orthogonal to the opposing direction of the external electrode 305 and the external electrode 306, the series connection circuit of the capacitor C1 and the capacitor C2 is severed in the equivalent circuit of FIG. 5D, so that the capacitance of the chip capacitor 300 is lost.

Hence, a range of the trimming processing position (capacitance variation range) in which the capacitance of the chip capacitor 300 can be varied in the trimming electrode 302M depends on the size of the opposed surfaces of the trimming electrode 302M and the internal electrodes 303 and 304. For example, when a part of the trimming electrode 302M opposed to the internal electrode 303 is trimmed, the range of the trimming processing position (capacitance variation range) in which the capacitance of the chip capacitor 300 can be varied is a range TM in which at least the opposed surfaces of the trimming electrode 302M and the internal electrode 303 are formed, as shown in FIG. 5C.

As shown in FIGS. 6A and 6B, when the trimming electrode 302M is trimmed by the laser beam at the trimming position Ps within the range TM, of regions of the trimming electrode 302M which regions are opposed to the internal electrode 303 and the internal electrode 304, only the region on the right side of the processing trace 313 (side of the external electrode 306) effectively contributes to the capacitance of the chip capacitor 300. At this time, the capacitance of the chip capacitor 300 is changed by the trimming processing so as to be smaller than the initial capacitance because the area of the effectively contributing region of the trimming electrode 302M is smaller than the area of the whole of the trimming electrode 302M.

In the position indicator 100 according to the present embodiment, as described above, the trimming processing of the capacitors 112 and 113 with the laser beam is applied to these capacitors 112 and 113 attached to the printed board 108 housed within the case 101 of the position indicator 100 after the position indicator 100 is assembled.

As described above, in this case, the laser beam is made incident on the capacitors 112 and 113 disposed on the printed board 108 through the through hole 116 for the depression operating element 117 for depressing the side switch 111, which through hole 116 is formed in the side surface of the first case 102 of the case 101. The changing of the capacitance by the trimming processing at this time is performed by using an automatic machine so that the resonance frequency of the resonance circuit 118 including the coil 106 and the capacitors 112 and 113 becomes a desired frequency as described above. That is, the trimming electrodes 302 of the capacitors 112 and 113 are trimmed by the laser beam while the automatic machine measures the resonance frequency of the resonance circuit 118.

In this case, in order to make the resonance frequency the desired frequency, although the trimming of the trimming electrodes 302M of the capacitors 112 and 113 by the laser beam may be completed at one trimming position as shown in FIGS. 6A and 6B, the trimming of the trimming electrodes 302M of the capacitors 112 and 113 by the laser beam is generally completed with trimming processing at a plurality of trimming positions. In that case, a plurality of processing traces are formed in the trimming electrode 302M of the chip capacitor 300 forming the capacitors 112 and 113.

Incidentally, in the foregoing embodiment, the laser beam is made incident on the trimming electrode 302 of the chip capacitor 300 forming the capacitors 112 and 113 within the case 101 through the through hole 116 for the side switch 111, which through hole 116 is provided in the first case 102 of the position indicator 100. However, this method cannot be used in a case of a position indicator without the side switch 111.

FIGS. 7A and 7B are diagrams of assistance in explaining an example of a method by which, even in a position indicator without the side switch 111, a capacitance adjusting capacitor within a case of the position indicator 100 can be trimmed by a laser beam.

FIG. 7A is a diagram showing a coupling portion of the first case 102 of the position indicator 100 according to the foregoing embodiment, which coupling portion is to be coupled to the second case 103. In the present example, a printed board 120 has a shape including a portion 120a bent perpendicularly in the end portion on the opening side of the first case 102. This printed board 120 can be formed by using a flexible board, for example.

The capacitors forming the resonance circuit together with the coil 106 and the like are disposed on the printed board 120. As shown in FIGS. 7A and 7B, the chip capacitor 300 forming a capacitance adjusting capacitor for adjusting the resonance frequency of the resonance circuit of the position indicator 100 to a desired value is attached to the perpendicularly bent portion 120a of the printed board 120, and is attached such that the trimming electrode 302 faces the opening side of the first case 102.

Hence, in the present example, as indicated by an arrow in FIG. 7A, the trimming electrode 302 of the chip capacitor 300 can be irradiated with a laser beam from the opening of the first case 102. As indicated by arrows in FIG. 7B, the trimming electrode 302 of the chip capacitor 300 can be trimmed by the laser beam.

Incidentally, while only the half region (left half) of the trimming electrode 302M, which region is on the side of the external electrode 305, is trimmed as shown in FIGS. 5A to 5D in the description of the chip capacitor 300 in the foregoing first construction example, it is also possible to trim only the half (right half) of the trimming electrode 302M, which half is on the side of the external electrode 306. In addition, it is possible to trim both of the half region (left half) of the trimming electrode 302M on the side of the external electrode 305 and the half (right half) of the trimming electrode 302M on the side of the external electrode 306 together.

<Second Example of Construction of Capacitance Adjusting Capacitors 112 and 113>

Figure 8A:
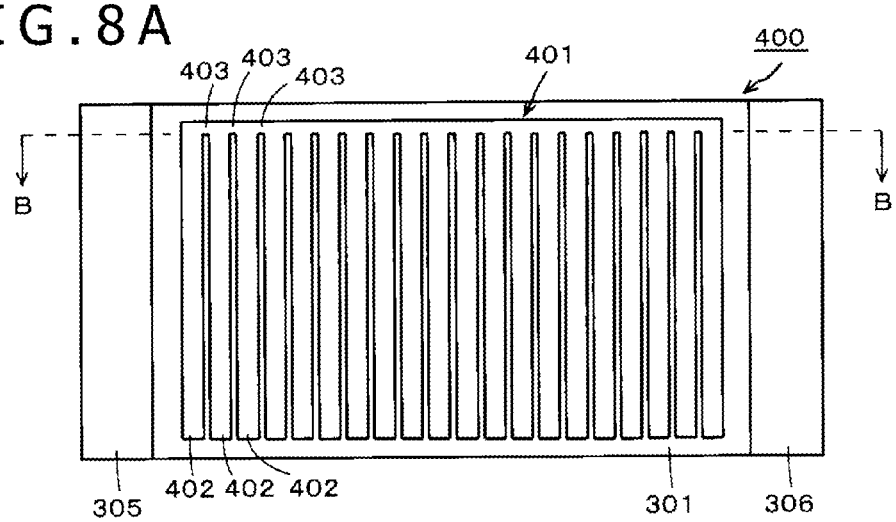
FIGS. 8A, 8B, and 8C are diagrams of assistance in explaining a second example of construction of the capacitance adjusting capacitor used in the embodiment of the position indicator according to the present invention and an example of trimming of a trimming electrode in the second construction example.
Figure 8B:
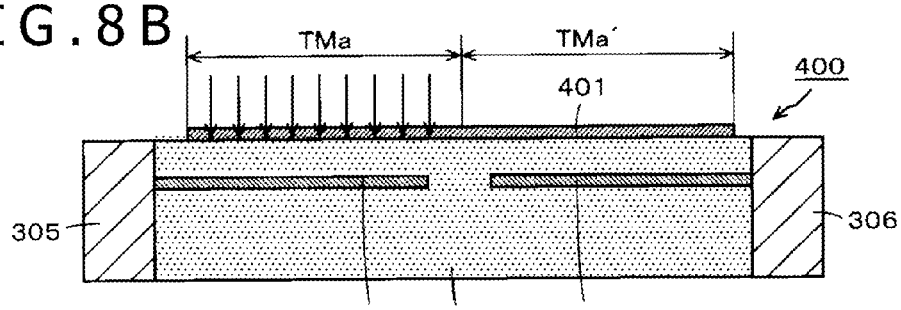
Figure 8C:
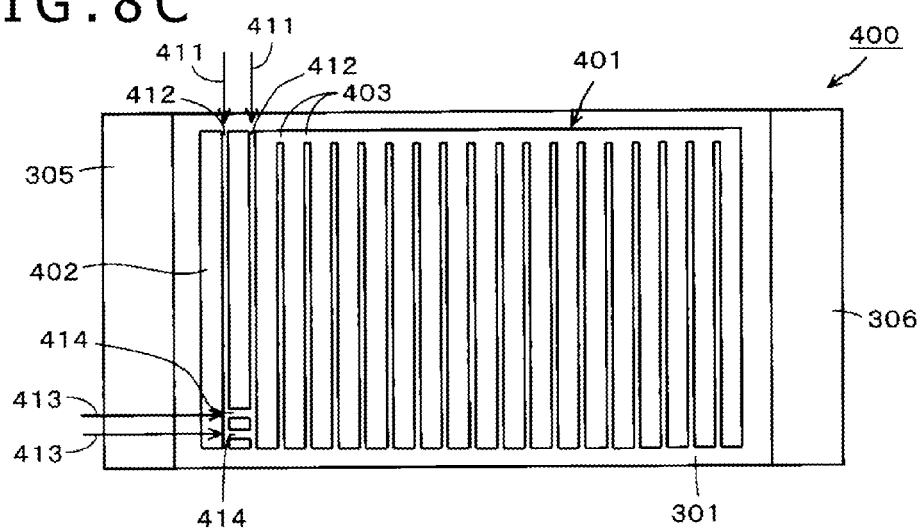

FIGS. 8A to 8C are diagrams showing a chip capacitor 400 in a second example of construction of the capacitance adjusting capacitors 112 and 113. FIG. 8A is a top view of the chip capacitor 400. FIG. 8B is a sectional view taken along a line B-B of FIG. 8A. FIG. 8C is a diagram of assistance in explaining trimming processing in the chip capacitor 400 in the second construction example.

The chip capacitor 400 in the present second construction example is different from the chip capacitor 300 in the foregoing first example only in terms of the construction of a trimming electrode, and is otherwise similar in construction to the chip capacitor 300 in the foregoing first example. Accordingly, in FIGS. 8A to 8C, the same parts as in the chip capacitor 300 in the foregoing first example are identified by the same reference numerals, and description thereof will be omitted.

The chip capacitor 300 in the first example, which chip capacitor 300 forms the capacitance adjusting capacitors 112 and 113 as described above, has the trimming electrode 302 formed uniformly on one surface of the dielectric 301. Therefore, a distance of scanning with a laser beam at the time of trimming processing is equal to the length in the vertical direction of the trimming electrode 302, which length is shown in FIG. 5B, and is thus relatively long.

However, when the distance of scanning with a laser beam at the time of trimming processing is long, the irradiation time of the laser beam is also long, and a portion of the dielectric 301 in the chip capacitor which is irradiated with the laser beam is increased in temperature, which may cause a crack and change characteristics with the dielectric material transformed into a semiconductor.

The chip capacitor 400 in the second construction example as shown in FIGS. 8A to 8C is an example in which the problems of the chip capacitor 300 in the first construction example can be avoided.

Specifically, in the chip capacitor 400 in the second construction example, a trimming electrode 401 having a comb-shaped electrode pattern is formed on an upper surface of a dielectric 301 opposed to at least one internal electrode of an internal electrode 303 and an internal electrode 304 in the dielectric 301. This trimming electrode 401 corresponds to the trimming electrode 302M of the chip capacitor 300 in the foregoing first construction example. The trimming electrode 401 has a rectangular shape as a whole, and is formed in a state of being electrically separated from external electrodes 305 and 306.

As shown in FIG. 8A, the trimming electrode 401 has a plurality of band-shaped electrode patterns disposed as capacitance forming region portions 402 so as to be separated from each other by a predetermined distance in an opposing direction of the external electrode 305 and the external electrode 306, and has coupling portions 403 for electrically connecting the respective electrode patterns to each other. Incidentally, the coupling portions 403 are disposed in the same position along a direction orthogonal to the opposing direction of the external electrode 305 and the external electrode 306. In the present example, the coupling portions 403 are formed at one end regions in a longitudinal direction of the respective capacitance forming region portions 402, but are not necessarily limited to the end regions, as a matter of course. Incidentally, in order to facilitate the adjustment of the capacitance of the capacitance adjusting capacitor by an automatic machine, the coupling portions 403 for electrically connecting the respective electrode patterns to each other are desirably formed linearly in positions at equal intervals in the opposing direction of the external electrode 305 and the external electrode 306 or the direction orthogonal to the opposing direction of the external electrode 305 and the external electrode 306. In addition, because the adjustment of the capacitance of the capacitance adjusting capacitor by an automatic machine is made by severing a number of coupling portions of these coupling portions 403 according to a need, the distance in the severing direction of the coupling portions 403 is desirably as short as possible.

In this case, a gap is formed between capacitance forming region portions 402 adjacent to each other, excluding the portion of a coupling portion 403. When the trimming electrode 401 is severed at the coupling portion 403 in the longitudinal direction of the capacitance forming region portions 402, the capacitance forming region portions 402 adjacent to each other are electrically separated from each other.

In the chip capacitor 400 in the second construction example, when each of coupling portions 403 is irradiated with a laser beam with a direction (vertical direction of the upper surface of the chip capacitor 400) orthogonal to the opposing direction of the external electrodes 305 and 306, that is, the longitudinal direction of the capacitance forming region portions 402 as a scanning direction as indicated by arrows 411 in FIG. 8C, carbon forming the coupling portions 403 disappears, so that the capacitance forming region portions 402 are severed. Then, a trimming processing trace 412 in which the dielectric 301 is exposed is created in the coupling portions 403.

In the second construction example, the trimming processing of the coupling portions 403 with a laser beam can change the area of the trimming electrode 401 opposed to at least one internal electrode of the internal electrodes 303 and 304 in each of the capacitance forming region portions 402. The changing of the capacitance by the trimming processing is performed as a coarse adjustment of the capacitance of the chip capacitor 400. That is, in the example of FIGS. 8A to 8C, when the severing is carried out in a direction from the position of the external electrode 305 or the external electrode 306 to the center of the chip capacitor 400 while trimming processing is applied with a laser beam to one of the positions of the coupling portions 403, one or a plurality of capacitance forming region portions 402 severed by the coupling portion 403 and located in the direction of the external electrode 305 or the external electrode 306 do not contribute to the capacitance of the chip capacitor 400. Thus, a capacitance smaller than an initial capacitance is formed in the chip capacitor 400.

A range TMa in the second example which corresponds to the range TM of the trimming processing position in the case of the chip capacitor 300 in the first construction example is a range (capacitance variation range) of the trimming processing position in the coarse adjustment of the capacitance of the chip capacitor 400.

In the chip capacitor 400 in the second construction example, the area of the capacitance forming region portions 402 opposed to at least one internal electrode of the internal electrode 303 and the internal electrode 304 can be changed by trimming, by a laser beam, one or a plurality of capacitance forming region portions 402 themselves (and not the coupling portions 403), which are located closer to the central portion of the chip capacitor 400 than the position of the coupling portion 403 severed by the above-described coarse adjustment and which contribute to the capacitance of the chip capacitor 400. Thereby fine adjustment of the capacitance of the chip capacitor 400 can be made.

In this case, the scanning direction of the laser beam in the trimming processing of a capacitance forming region portion 402 can be the same direction as the scanning direction of the laser beam when a coupling portion 403 is trimmed. However, in the second construction example, as shown in FIG. 8C, the direction of the laser beam in the trimming processing applied to a capacitance forming region portion 402 for the fine adjustment of the capacitance is a direction (opposing direction of the external electrodes 305 and 306) orthogonal to the scanning direction of the laser beam when a coupling portion 403 is trimmed.

Specifically, when a capacitance forming region portion 402 in which to make the fine adjustment is irradiated with a laser beam with the opposing direction of the external electrodes 305 and 306 as the scanning direction as indicated by arrows 413 in FIG. 8C, carbon forming the capacitance forming region portion 402 disappears, so that the capacitance forming region portion 402 is severed. Then, a trimming processing trace 414 in which the dielectric 301 is exposed is created in the portion in which the carbon disappeared. The capacitance of the chip capacitor 400 is smaller by an area severed from one or a plurality of capacitance forming region portions 402 contributing to the capacitance of the chip capacitor 400 than the capacitance before the severing.

As described above, the scanning distance and the scanning time of the laser beam at the time of trimming processing in the chip capacitor 400 in the foregoing second construction example can be made shorter than in the chip capacitor 300 in the first construction example, so that the problems in the case of the chip capacitor in the first construction example can be remedied.

Because the chip capacitor 400 in the second construction example allows coarse adjustment and fine adjustment in trimming processing using a laser beam, the resonance frequency of the resonance circuit of the position indicator 100 can be adjusted to a more desired value quickly.

Incidentally, while only the half region of the trimming electrode 401 which is on the side of the external electrode 305 is trimmed also in the description of the chip capacitor 400 in the foregoing second construction example, it is also possible to trim only the half (right half) of the trimming electrode 401 which is on the side of the external electrode 306. A range (capacitance variation range) of the trimming processing position in the coarse adjustment of the capacitance of the chip capacitor 400 in that case is a range TMa' shown in FIG. 8B. In addition, it is possible to trim both of the half region (left half) of the trimming electrode 401 which is on the side of the external electrode 305 and the half (right half) of the trimming electrode 401 which is on the side of the external electrode 306 together.

<Third Example of Construction of Capacitance Adjusting Capacitors 112 and 113>

FIGS. 9A to 9C are diagrams showing a chip capacitor 500 in a third example of construction of the capacitance adjusting capacitors 112 and 113. FIG. 9A is a top view of the chip capacitor 500. FIG. 9B is a sectional view taken along a line C-C of FIG. 9A. FIG. 9C is a diagram of assistance in explaining trimming processing in the chip capacitor 500 in the third construction example.

The chip capacitor 500 in the present third construction example is also different from the chip capacitor 300 in the foregoing first example and the chip capacitor 400 in the second construction example only in terms of the construction of a trimming electrode, and is otherwise similar in construction to the chip capacitor 300 in the foregoing first example and the chip capacitor 400 in the second construction example. Accordingly, in FIGS. 9A to 9C, the same parts as in the chip capacitor 300 in the foregoing first example and the chip capacitor 400 in the second construction example are identified by the same reference numerals, and description thereof will be omitted.

In the construction of a trimming electrode 501 of the chip capacitor 500 in the third construction example, as compared with the construction of the trimming electrode 401 of the chip capacitor 400 in the second construction example, capacitance forming region portions 402 arranged in the opposing direction of external electrodes 305 and 306 are formed so as to be opposed to one internal electrode of an internal electrode 303 and an internal electrode 304, and a region portion in which capacitance forming region portions 402 are not formed is provided as a uniform pattern (so-called a solid pattern).

Specifically, as shown in FIG. 9A, the trimming electrode 501 of the chip capacitor 500 in the third construction example has a plurality of capacitance forming region portions 402 disposed at predetermined intervals in the opposing direction of the external electrode 305 and the external electrode 306 in a half region on the side of the external electrode 305 so as to be opposed to the internal electrode 303. Capacitance forming region portions 402 are not formed in a half region on the side of the external electrode 306 in the trimming electrode 501. Therefore the area of the trimming electrode 501 which is opposed to the internal electrode 304 can be maximized.

In addition, the number of capacitance forming region portions 402 contributing to the capacitance of the chip capacitor 500 which is determined by the trimming processing of coupling portions 403 may be changed by changing a length ratio between the internal electrode 303 and the internal electrode 304 in the opposing direction of the external electrode 305 and the external electrode 306, or in other words the area of each of the internal electrode 303 and the internal electrode 304, and disposing capacitance forming region portions 402 corresponding to the change in the area in the trimming electrode 501. In such a case, in addition to being able to coarsely adjust the capacitance of the chip capacitor 500 and finely adjust the capacitance of the chip capacitor 500 by changing the area of capacitance forming region portions 402 contributing to the capacitance of the chip capacitor 500 by trimming processing according to a need, characteristics of change in capacitance of the chip capacitor 500 which correspond to the extent of the trimming processing can be approximated to desired characteristics.

Incidentally, while the foregoing example has been described supposing that the widths of the respective capacitance forming region portions 402 in the opposing direction of the external electrode 305 and the external electrode 306 are fixed, the capacitance of the chip capacitor 500 can be changed nonlinearly so as to correspond to the extent of trimming processing by varying the widths of the capacitance forming region portions 402.

<Fourth Example of Construction of Capacitance Adjusting Capacitors 112 and 113>

Figure 10A:
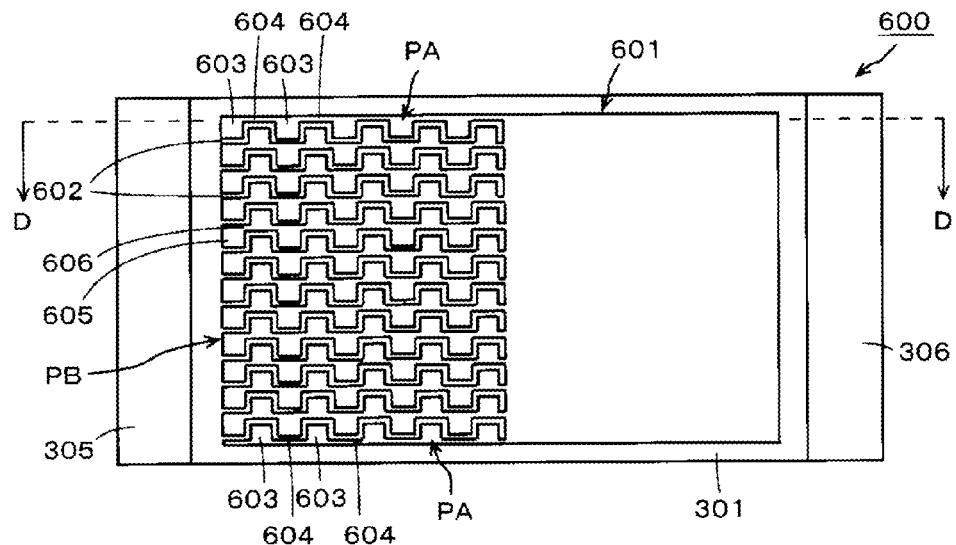
FIGS. 10A, 10B, and 10C are diagrams of assistance in explaining a fourth example of construction of the capacitance adjusting capacitor used in the embodiment of the position indicator according to the present invention and an example of trimming of a trimming electrode in the fourth construction example.
Figure 10B:
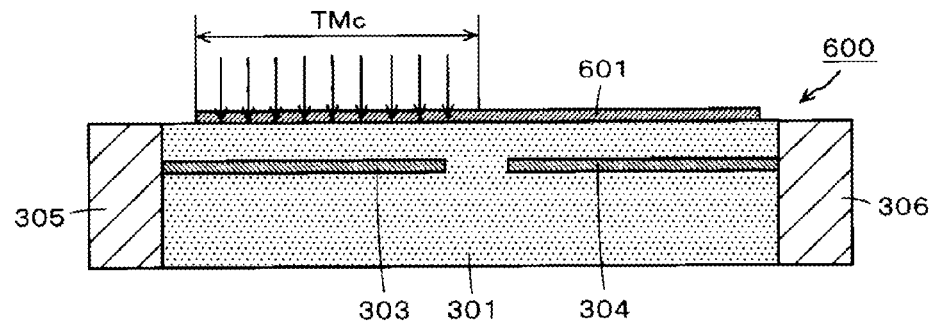
Figure 10C:
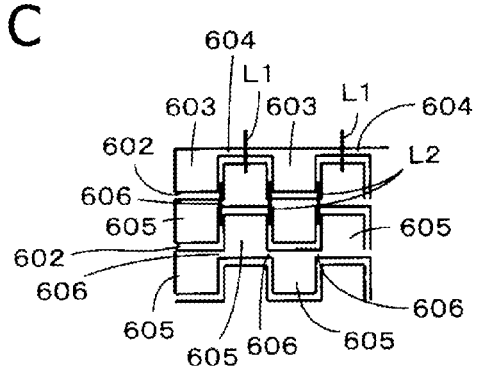

FIGS. 10A to 10C are diagrams showing a chip capacitor 600 in a fourth example of construction of the capacitance adjusting capacitors 112 and 113. FIG. 10A is a top view of the chip capacitor 600. FIG. 10B is a sectional view taken along a line D-D of FIG. 10A. FIG. 10C is a diagram of assistance in explaining trimming processing in the chip capacitor 600 in the fourth construction example.

The chip capacitor 600 in the present fourth construction example is different from the chip capacitor 300 in the foregoing first example only in terms of the construction of a trimming electrode, and is otherwise similar in construction to the chip capacitor 300 in the foregoing first example. Accordingly, in FIGS. 10A to 10C, the same parts as in the chip capacitor 300 in the foregoing first example are identified by the same reference numerals, and description thereof will be omitted.

As with the chip capacitors 400 and 500 in the second construction example and the third construction example, the chip capacitor 600 in the present fourth construction example is an example in which a trimming electrode 601 is formed so as to be able to shorten the scanning distance and scanning time of a laser beam.

As shown in FIG. 10A, the trimming electrode 601 of the chip capacitor 600 in the fourth construction example includes a plurality of capacitance forming region portions 605 each having a zigzag shape, the plurality of capacitance forming region portions 605 being arranged in (along) a direction orthogonal to the opposing direction of external electrodes 305 and 306, in place of the plurality of capacitance forming region portions 402 disposed in the trimming electrode 501 of the chip capacitor 500 in the foregoing third construction example. One ends of the respective capacitance forming region portions 605 are coupled to each other to form the trimming electrode 601, and other ends of the capacitance forming region portions 605 are in an open state. Each of the capacitance forming region portions 605 located at both ends (an upper end portion and a lower end portion) in the direction orthogonal to the opposing direction of the external electrodes 305 and 306 in the trimming electrode 601 is a shape pattern PA formed by coupling a plurality of square capacitance forming region portions 603 to each other by narrow coupling portions 604. The length of the coupling portions 604 in the direction orthogonal to the opposing direction of the external electrodes 305 and 306 is shorter than the length in the same direction of the square capacitance forming region portions 603.

In addition, the capacitance forming region portions 605 located between the upper end portion and the lower end portion are a shape pattern PB formed by disposing a plurality of square capacitance forming region portions 605 in a staggered form in the opposing direction of the external electrodes 305 and 306 and connecting and coupling the adjacent square capacitance forming region portions 605 to each other by narrow coupling portions 606. In this case, the length of the coupling portions 606 in the direction orthogonal to the opposing direction of the external electrodes 305 and 306 is shorter than the length in the same direction of the square capacitance forming region portions 605.

The square capacitance forming region portions 603 of the shape patterns PA and the square capacitance forming region portions 605 of the shape patterns PB have the same size. In addition, as shown in FIG. 10A, the square capacitance forming region portions 605 of a plurality of the shape patterns PB are disposed in a line in the direction orthogonal to the opposing direction of the external electrode 305 and the external electrode 306 between a square capacitance forming region portion 603 of one of the shape patterns PA at the upper end portion and the lower end portion and a coupling portion 604 of the other of the shape patterns PA at the upper end portion and the lower end portion.

Trimming processing with a laser beam in the trimming electrode 601 of the chip capacitor 600 in the fourth construction example is applied to the coupling portions 604 of the shape patterns PA and the coupling portions 606 of the shape patterns PB.

As shown in FIG. 10C, in the shape pattern PA disposed at the upper end portion, each capacitance forming region portion 603 can be severed by scanning coupling portions 604 with a laser beam in the direction orthogonal to the opposing direction of the external electrode 305 and the external electrode 306, as indicated by solid lines L1. Though not shown in FIG. 10C, trimming processing traces in which a dielectric 301 is exposed are created by the scanning of the coupling portions 604 with the laser beam, as in the foregoing.

In addition, in the shape pattern PB, each capacitance forming region portion 605 is severed by scanning coupling portions 606 with a laser beam in the direction orthogonal to the opposing direction of the external electrode 305 and the external electrode 306, as indicated by solid lines L2. Trimming processing traces in which the dielectric 301 is exposed are created by the scanning of the coupling portions 604 and the coupling portions 606 with the laser beam, as in the foregoing.

As is clear from FIGS. 10A to 10C, a plurality of capacitance forming region portions 603 or capacitance forming region portions 605 arranged in the opposing direction of the external electrode 305 and the external electrode 306 can be severed en bloc by selecting the position of a coupling portion 604 or a coupling portion 606 to be subjected to trimming processing in the opposing direction of the external electrode 305 and the external electrode 306. In addition, coarse adjustment as described above can be made when trimming processing is performed by irradiating, with a laser beam, a coupling portion 604 or a coupling portion 606 formed in the vicinity of the right half region of the trimming electrode 601 formed as a uniform (solid) electrode pattern, so that the scanned portion is made to disappear and the shape pattern PA or the shape pattern PB as a unit is severed. It is needless to say that fine adjustment can be made in units of square capacitance forming region portions 603 or square capacitance forming region portions 605.

The capacitance of the chip capacitor 600 becomes smaller than an initial capacitance by the area of capacitance forming region portions 603 and capacitance forming region portions 605 that are severed in the trimming electrode 601. In addition, a trimming range TMc in the case of the chip capacitor 600 is a region in which the zigzag shape pattern of the left half of the trimming electrode 601 shown in FIGS. 10A and 10B is formed.

As described above, in the chip capacitor 600 in the fourth construction example described above, trimming processing is performed by irradiating coupling portions 604 and 606 with a laser beam. Thus, the scanning distance and scanning time of the laser beam can be made shorter than in the chip capacitor 300 in the first construction example, so that the problems in the case of the chip capacitor in the first construction example can be remedied.

In addition, the chip capacitor 600 in the fourth example allows the capacitance to be changed in each of the square capacitance forming region portions 603 and 605, and thus produces an effect of facilitating the securing of a desired capacitance.

Incidentally, the capacitance forming region portions in the patterns PA and PB in the above fourth example are square. However, the capacitance forming region portions in the patterns PA and PB are not limited to the square shape, but can be various shapes such as a triangular shape, for example.

<Fifth Example of Construction and Sixth Example of Construction of Capacitance Adjusting Capacitors 112 and 113>

FIGS. 11A and 11B are diagrams showing a chip capacitor 700 in a fifth example of construction of the capacitance adjusting capacitors 112 and 113. FIG. 11A is a top view of the chip capacitor 700. FIG. 11B is a sectional view taken along a line E-E of FIG. 11A. FIGS. 12A and 12B are diagrams showing a chip capacitor 800 in a sixth example of construction of the capacitance adjusting capacitors 112 and 113. FIG. 12A is a top view of the chip capacitor 800. FIG. 12B is a sectional view taken along a line F-F of FIG. 12A.

The chip capacitor 700 in the fifth construction example and the chip capacitor 800 in the sixth construction example are different from the chip capacitor 300 in the foregoing first example only in terms of the construction of a trimming electrode, and are otherwise similar in construction to the chip capacitor 300 in the foregoing first example. Accordingly, in FIGS. 11A and 11B and FIGS. 12A and 12B, the same parts as in the chip capacitor 300 in the foregoing first example are identified by the same reference numerals, and description thereof will be omitted.

As with the chip capacitors 400 to 600 in the second to fourth construction examples, the chip capacitor 700 in the fifth construction example and the chip capacitor 800 in the sixth construction example are examples in which a trimming electrode 701 and a trimming electrode 801 are formed so as to be able to shorten the scanning distance and scanning time of a laser beam.

As shown in FIG. 11A and FIG. 12A, the trimming electrode 701 of the chip capacitor 700 in the fifth construction example and the trimming electrode 801 of the chip capacitor 800 in the sixth construction example have a plurality of independent strip-shaped electrodes 702 to 705 and 802, respectively, separated from each other in a direction orthogonal to the opposing direction of external electrodes 305 and external electrodes 306, the plurality of independent strip-shaped electrodes 702 to 705 and 802 being formed in rectangular electrode regions electrically separated from the respective external electrodes 305 and 306, the rectangular electrode regions corresponding to the trimming electrode 302M of the chip capacitor 300 in the foregoing first construction example.

The plurality of strip-shaped electrodes 702 to 705 forming the trimming electrode 701 of the chip capacitor 700 in the fifth construction example have lengths selected to be equal to each other in the opposing direction of the external electrode 305 and the external electrode 306, and have lengths W1 to W4 selected to be different from each other in the direction orthogonal to the opposing direction of the external electrode 305 and the external electrode 306. In the example of FIGS. 11A and 11B, the lengths W1 to W4 are defined such that

W1:W2:W3:W4=8:4:2:1

The plurality of strip-shaped electrodes 802 forming the trimming electrode 801 of the chip capacitor 800 in the sixth construction example have lengths selected to be equal to each other in the opposing direction of the external electrode 305 and the external electrode 306, and have lengths selected to be equal to each other in the direction orthogonal to the opposing direction of the external electrode 305 and the external electrode 306.

The scanning direction of a laser beam at a time of trimming processing with the laser beam in the fifth construction example and the sixth construction example is the direction orthogonal to the opposing direction of the external electrode 305 and the external electrode 306, as indicated by an arrow TR in FIG. 11A and FIG. 12A. Each of the strip-shaped electrodes 702 to 705 and 802 is trimmed by the laser beam. The trimming ranges of the chip capacitors 700 and 800 in the fifth construction example and the sixth construction example are TMd (see FIG. 11B) and TMe (see FIG. 12B), respectively.

In each of the fifth construction example and the sixth construction example, the lengths in the direction orthogonal to the opposing direction of the external electrode 305 and the external electrode 306 are shorter than the lengths in the opposing direction of the external electrode 305 and the external electrode 306. Therefore the problems in the chip capacitor 300 in the first construction example can be avoided.

In the fifth construction example, the lengths W1 to W4 are selected as described above to set an area ratio in a multiplication relation. Therefore, the capacitance of the chip capacitor 700 can be adjusted in a substantially analog manner from a maximum capacitance to a minimum capacitance by trimming the trimming electrode 701 in each of the strip-shaped electrodes 702 to 705 by a laser beam.

Specifically, in the trimming electrode 701 of the chip capacitor 700, when trimming processing is performed by irradiating the strip-shaped electrode 705 with a laser beam with a position at a right end of the trimming range TMd as a trimming position, the strip-shaped electrode 705 is severed, and thereby the whole of the strip-shaped electrode 705 does not contribute to the capacitance of the chip capacitor 700. That is, when the strip-shaped electrode 705 is severed into halves, a region in which the electrode 705 is opposed to the internal electrode 303 and a region in which the electrode 705 is opposed to the internal electrode 304 are electrically severed from each other, whereby the electrode 705 does not contribute to the capacitance of the chip capacitor 700. The same is true for the other strip-shaped electrodes 702 to 704. The capacitance of the chip capacitor 700 can be adjusted by thus severing each of the strip-shaped electrodes.

In addition, when for example the strip-shaped electrode 704 is trimmed gradually from the left side (side of the external electrode 305) of the strip-shaped electrode 704, because the length W3 of the strip-shaped electrode 704 is double the length W4 of the strip-shaped electrode 705, the capacitance of the chip capacitor 700 can be changed in a substantially analog manner.

In addition, the chip capacitor 800 in the sixth construction example has an advantage in that the irradiation distance and irradiation time of the laser beam can always be reduced, because the length in the scanning direction of the laser beam is the same in all of the strip-shaped electrodes 802.

[Other Modifications]

In the foregoing embodiments, the chip capacitors forming the capacitance adjusting capacitors 112 and 113 have a construction in which a trimming electrode electrically separated from external electrodes is provided on the surface of a dielectric in an exposed state and two internal electrodes are provided within the dielectric so as to be opposed to the trimming electrode. However, the chip capacitors covered by the present invention are not limited to such a construction.

Figure 13A:
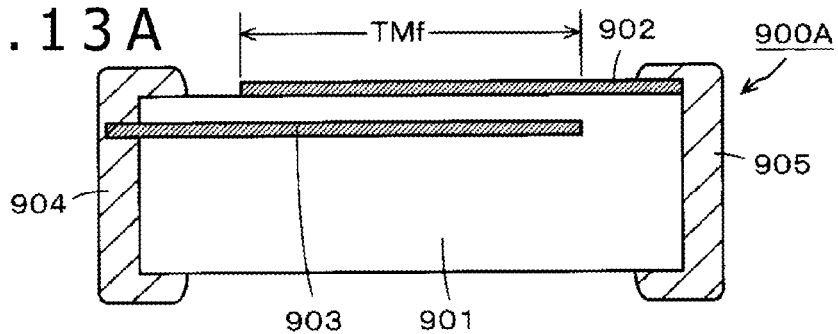
FIGS. 13A, 13B, and 13C are diagrams of assistance in explaining another example of the capacitance adjusting capacitor used in the embodiment of the position indicator according to the present invention.

In a chip capacitor 900A in an example of FIG. 13A, a trimming electrode 902 is formed on an upper surface of a dielectric 901, and one internal electrode 903 is provided within the dielectric 901 so as to be opposed to the trimming electrode 902 with part of the dielectric 901 interposed in between. External electrodes 904 and 905 are formed on side portions of the dielectric 901, which side portions are opposed to each other. One external electrode 905 and the trimming electrode 902 are electrically connected to each other. The other external electrode 904 and the internal electrode 903 are electrically connected to each other.

In the example of FIG. 13A, the whole of a portion in which the trimming electrode 902 and the internal electrode 903 are opposed to each other is a range TMf in which trimming processing with a laser beam can be performed. Incidentally, the trimming electrode 902 may be a uniform electrode pattern as in the foregoing first construction example, or may be one of the electrode patterns in the second to sixth construction examples.

Figure 13B:
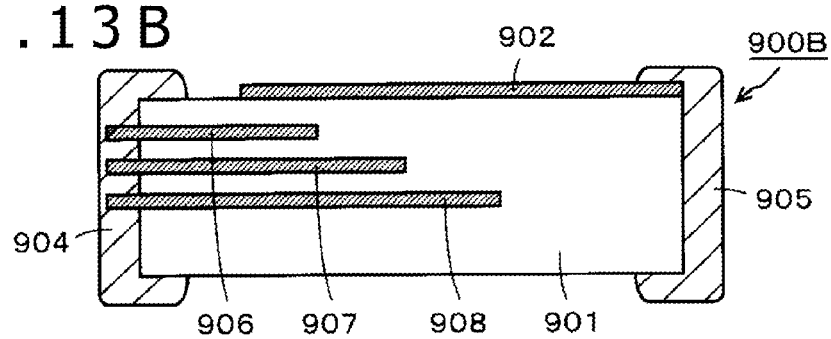

FIG. 13B represents a modification of the chip capacitor 900A in FIG. 13A. A chip capacitor 900B in the example of FIG. 13B is formed by providing, as an internal electrode opposed to a trimming electrode 902, a plurality of internal electrodes 906, 907, and 908 having different opposing distances to the trimming electrode 902 within a dielectric 901.

According to the chip capacitor 900B in the example of FIG. 13B, characteristics of change in capacitance of the chip capacitor 900B after trimming processing with a laser beam according to an area severed by the trimming processing in the trimming electrode 902 can be adjusted to be desired characteristics by the plurality of internal electrodes 906 to 908.

Figure 13C:
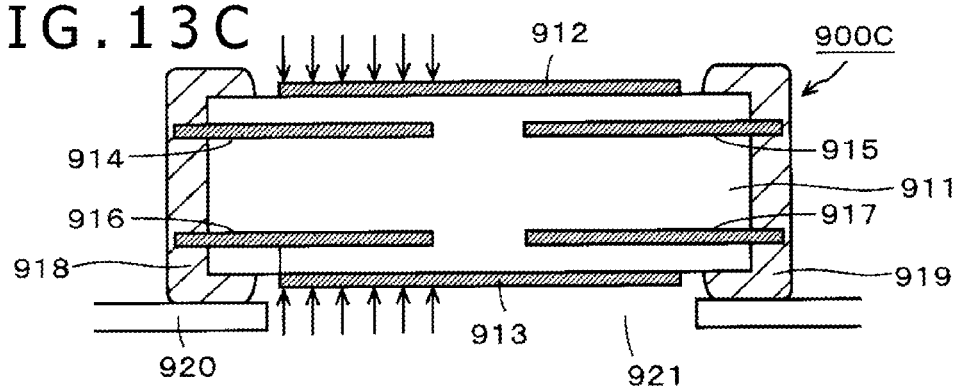

FIG. 13C represents a modification of the above-described chip capacitors 300 to 800. The chip capacitors 300 to 800 in the few construction examples described above have a trimming electrode formed only on the upper surface of the dielectric 301. In that case, however, trimming processing with a laser beam is performed on only the upper surface of the dielectric 301, and therefore the dielectric 301 may be warped due to heat. The example of FIG. 13C is an example of a chip capacitor 900C in which this problem is remedied.

Specifically, the chip capacitor 900C has a trimming electrode 912 formed on an upper surface of a dielectric 911, and also has a trimming electrode 913 formed on a lower surface of the dielectric 911. The trimming electrodes 912 and 913 may have any of the constructions in the first to sixth construction examples of the chip capacitors described above.

The chip capacitor 900C in the present example has two internal electrodes 914 and 915 provided inside the dielectric 911 so as to be opposed to the trimming electrode 912 formed on the upper surface with part of the dielectric 911 interposed in between, and has two internal electrodes 916 and 917 provided inside the dielectric 911 so as to be opposed to the trimming electrode 913 formed on the lower surface with part of the dielectric 911 interposed in between.

An external electrode 918 is formed in a state of being electrically connected to the internal electrode 914 and the internal electrode 916, and an external electrode 919 is formed in a state of being electrically connected to the internal electrode 915 and the internal electrode 917.

As described above, the chip capacitor 900C in the present example is formed so as to be symmetric on the upper side and the lower side of the dielectric 911 with respect to a central position in a direction of thickness of the dielectric 911 as an axis of symmetry. The chip capacitor 900C in the present example allows trimming processing with a laser beam to be applied to not only the trimming electrode 912 on the upper surface but also the trimming electrode 913 on the lower surface, as indicated by arrows in FIG. 13C. In this case, when the trimming processing is performed in a state of the chip capacitor 900C being attached to a printed board 920, a through hole 921 is formed in advance in a position corresponding to the lower surface of the chip capacitor 900C in the printed board 920, and the trimming electrode 913 on the lower surface of the chip capacitor 900C is irradiated with a laser beam via the through hole 921.

According to the chip capacitor 900C in the example shown in FIG. 13C, the trimming electrodes and the internal electrodes are provided symmetrically in the direction of thickness of the dielectric 911, and trimming processing with a laser beam is performed on both of the upper surface and the lower surface of the dielectric 911. Therefore the dielectric 911 can be prevented from being warped.

Figure 14:
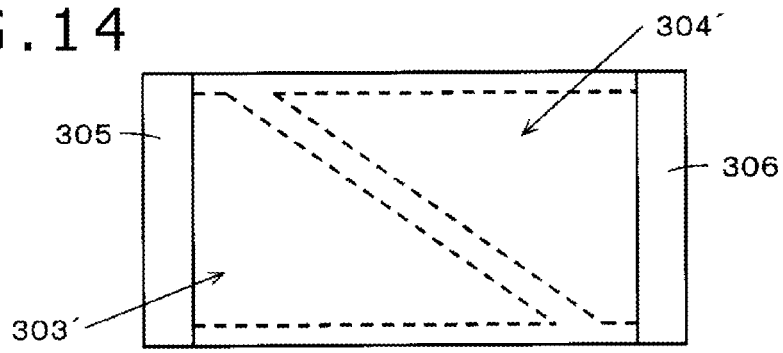
FIG. 14 is a diagram of assistance in explaining another example of the capacitance adjusting capacitor used in the embodiment of the position indicator according to the present invention.

In addition, in the construction examples of the chip capacitors described above, the two internal electrodes 303 and 304 both have a rectangular shape. However, the shape of the internal electrodes is not limited to a rectangular shape. For example, as shown in FIG. 14, internal electrodes 303' and 304' formed in triangular shapes opposed to each other may be used.

Figure 15:
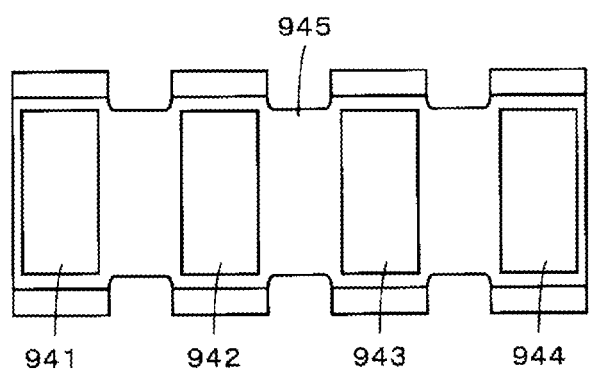
FIG. 15 is a diagram of assistance in explaining another example of the capacitance adjusting capacitor used in the embodiment of the position indicator according to the present invention.

Incidentally, the chip capacitors covered by the present invention are not limited to a single-body construction, but may be the construction of a chip array as an aggregate as shown in FIG. 15. Specifically, FIG. 15 shows an example of a chip array construction formed by coupling four chip capacitors 941, 942, 943, and 944 as an aggregate by a coupling member 945 made of resin, for example. In this case, each of the chip capacitors 941, 942, 943, and 944 may be any of the first to sixth construction examples of the chip capacitors described above.

Figure 16:
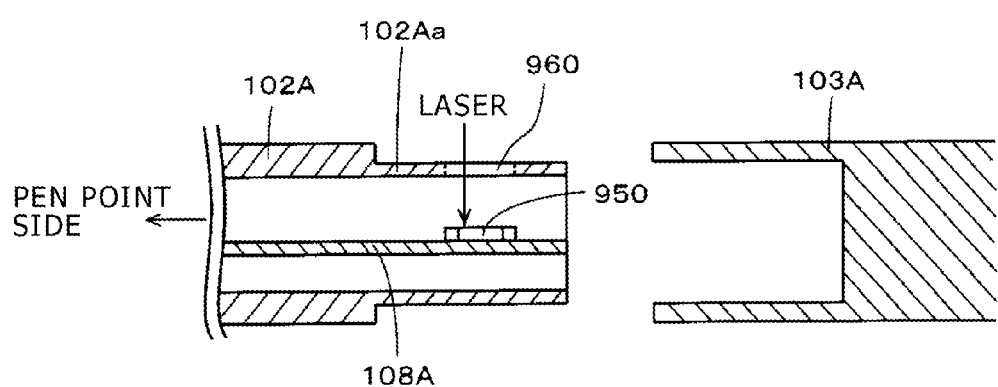
FIG. 16 is a diagram of assistance in explaining another example of trimming of the trimming electrode of the capacitance adjusting capacitor used in the embodiment of the position indicator according to the present invention.
Figure 17:
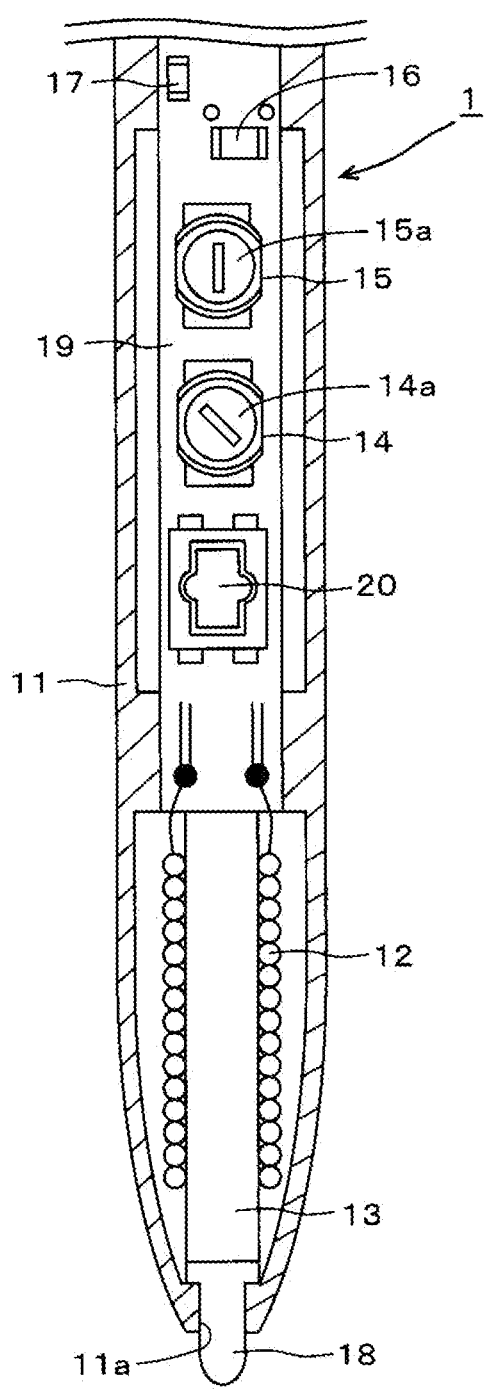
FIG. 17 is a diagram of assistance in explaining an example of construction of principal parts of a position indicator in related art.

FIG. 16 shows another construction example for irradiating a trimming electrode of a chip capacitor with a laser beam when applying trimming processing to the chip capacitor attached to a printed board in a state of the printed board being mounted in a position indicator.

Specifically, in the example shown in FIG. 16, a first case 102A of the position indicator 100 is concentrically engaged with a second case 103A. In the present example, the first case 102A is engaged with the second case 103A such that the second case 103A covers the outside of an engaging portion 102Aa of the first case 102A.

In the present example, prior to the engagement, trimming processing is applied with a laser beam to a trimming electrode (not shown) of a chip capacitor 950 attached to a printed board 108A housed within the first case 102A.

In this case, the chip capacitor 950 is disposed such that the position of disposition of the chip capacitor 950 on the printed board 108A is in the engaging portion 102Aa where the first case 102A is engaged with the second case 103A when the printed board 108A is housed within the first case 102A. A through hole 960 for irradiating the trimming electrode of the chip capacitor 950 with a laser beam is provided in the engaging portion 102Aa of the first case 102A.

This enables trimming processing to be performed by irradiating the trimming electrode of the chip capacitor 950 with a laser beam through the through hole 960. After the trimming processing is ended, the second case 103A is engaged with the first case 102A. Then, the through hole 960, which is formed in the engaging portion 102Aa, is hidden by the second case 103A and thus does not appear on the outside.

Incidentally, in the description of the above examples, description of a pen pressure detecting function in the position indicator and the position detecting device is omitted. However, a pen pressure detecting function can be incorporated by changing the inductance of the coil forming the resonance circuit according to pen pressure, as described in the above-described Patent Document 1, for example, or changing the resonance frequency by for example using a capacitor of a structure that changes capacitance according to pen pressure as part of the capacitors forming the resonance circuit. It is needless to say that in that case, the resonance frequency of the resonance circuit can be adjusted by the above-described capacitance adjusting capacitors in an exactly similar manner to the foregoing embodiments.

In addition, in the above description, adjustment of the resonance frequency of the resonance circuit is made by adjusting the capacitance of the capacitors forming the resonance circuit of the position indicator. However, it is needless to say that a capacitor according to the present invention is not limited to cases where the capacitor is used as a capacitor forming the resonance circuit of a position indicator to adjust the resonance frequency of the resonance circuit, but can be used in various electronic circuits including a capacitor, for example an oscillating circuit, for adjustment of characteristics of the electronic circuits, such for example as adjustment of oscillation frequency.

In addition, in the above description, a capacitor according to the present invention is used as a constituent part of an electronic circuit such as a resonance circuit, and the characteristics of the electronic circuit are adjusted by trimming the trimming electrode of the capacitor. However, the capacitance of the capacitor itself can be adjusted to be a predetermined capacitance by trimming the trimming electrode. That is, the present invention can provide a variable capacitance type capacitor adjusted to a predetermined capacitance by performing the above-described trimming processing in advance when the chip capacitor of the predetermined capacitance is shipped.

In addition, in the foregoing embodiments, the trimming electrode is formed of carbon or a mixture of carbon and silver. However, the material is not particularly limited to this. The trimming electrode may be formed by a method such as a printing method or a sputtering method using a conductive paste of a metal or an alloy of nickel (Ni), copper (Cu), silver-palladium (Ag—Pd), or palladium (Pd), for example. In this case, as described above, in order to perform alignment in the direction of rotation about the axial position of the position indicator for a proper direction of incidence of the laser beam in an automatic machine for making trimming processing adjustment to the position indicator, the trimming electrodes of the capacitance adjusting capacitors are desirably formed so as to be flat or like a flat shape and reflect light.

In addition, the trimming processing is not limited to cases where a trimming electrode is severed by being irradiated with a laser beam. A trimming electrode may be severed by being cut by a plate cutter or a disc cutter (rotating cutter), or a trimming electrode may be made to disappear partly or severed by being cut by a disc-shaped cutting tool.

Incidentally, in the description of the above embodiments, no protective film is formed on the trimming electrode. However, of course, the trimming electrode may be covered with a protective film, and the trimming electrode may be trimmed together with the protective film.

It should be understood by those skilled in the art that various modifications, combinations, sub-combinations and alterations may be formed depending on design requirements and other factors insofar as they are within the scope of the appended claims or the equivalents thereof.

The invention claimed is:

1. A position indicator comprising:
 a resonance circuit housed in a casing, the resonance circuit including an inductance element and a capacitor variable in capacitance and the resonance circuit resonating at a predetermined frequency, the position indicator being electromagnetically coupled to a position detecting device,
 wherein the capacitor forming the resonance circuit includes
  a dielectric,
  an electrode disposed on one side of the dielectric, and
  a trimming electrode disposed on another side of the dielectric such that at least one part of a region of the trimming electrode is opposed to the electrode with the dielectric interposed in between, to form the capacitance of the capacitor, the trimming electrode including multiple elongated portions extending in a first direction and connected at one ends and open-ended at other ends, each elongated portion includes a plurality of capacitor forming portions arranged along the first direction, each of the capacitor forming portions having a first width in a second direction orthogonal to the first direction, each adjacent pair of the capacitor forming portions being connected by a coupling portion having a second width smaller than the first width:
 the capacitor is housed in the casing such that the coupling portions of the trimming electrode are exposable from the casing, and
 one or more of the coupling portions are capable of being severed according to a resonance frequency desired for the resonance circuit.

2. The position indicator according to claim 1,
 wherein the electrode disposed on said one side of the dielectric includes a first electrode and a second electrode, and
 the trimming electrode includes regions disposed so as to be opposed to the first electrode and the second electrode, respectively, with the dielectric interposed in between.

3. The position indicator according to claim 2, wherein the first electrode and the second electrode are respectively connected to external electrodes of the capacitor.

4. The position indicator according to claim 3, wherein trimming has been performed for electrically separating the trimming electrode from at least one electrode of the external electrodes.

5. The position indicator according to claim 1,
 wherein
 each adjacent pair of the capacitor forming portions connected by the coupling portions are disposed on two opposite sides of the coupling portion, along the second direction, to form gaps between the capacitor forming portions on each side, and the capacitor forming portions of one of an adjacent pair of elongated portions are received in the gaps formed in another of the adjacent pair, respectively.

6. The position indicator according to claim 2,
 wherein the at least one part of the region forming the trimming electrode is disposed so as to be opposed to at least one electrode of the first electrode and the second electrode with the dielectric interposed in between.

7. The position indicator according to claim 2, wherein the first electrode and the second electrode are respectively housed in the dielectric so as to be disposed at positions equidistant from the trimming electrode.

8. The position indicator according to claim 1, wherein the electrode disposed on said one side of the dielectric is disposed within the dielectric so as to be opposed to the trimming electrode.

9. The position indicator according to claim 1, wherein each of the electrode disposed on said one side of the dielectric and the trimming electrode is connected to an external electrode of the capacitor.

10. The position indicator according to claim 1, wherein a user-operable element is to be disposed in a side surface of the casing, and the coupling portions of the trimming electrode are located in a vicinity of a position of the user-operable element, whereby the capacitor is housed in the casing such that the coupling portions of the trimming electrode are exposable from the casing when the user-operable element is not disposed.

11. The position indicator according to claim 1,
wherein the casing is formed by at least two members, and
the capacitor is housed in the casing such that the coupling portions of the trimming electrode are exposable from the casing when one member is not mounted on the other member.

12. The position indicator according to claim 1, wherein the area of the at least one part of the region forming the trimming electrode is dividable into an area contributing to the capacitance of the capacitor that corresponds to the resonance frequency desired for the resonance circuit and an area not contributing to the capacitor.

13. The position indicator according to claim 12, wherein the severing of the one or more of the coupling portions of the trimming electrode is performed optically or mechanically.

14. The position indicator according to claim 1, wherein the trimming electrode is formed of a material including carbon.

15. A capacitor comprising:

a dielectric;

an electrode disposed on one side of the dielectric; and a trimming electrode disposed on another side of the dielectric such that at least one part of a region of the trimming electrode is opposed to the electrode with the dielectric interposed in between, to form a capacitance of the capacitor, the trimming electrode including multiple elongated portions extending in a first direction and connected at one ends and open-ended at other ends, each elongated portion includes a plurality of capacitor forming portions arranged along the first direction, each of the capacitor forming portions having a first width in a second direction orthogonal to the first direction, each adjacent pair of the capacitor forming portions being connected by a coupling portion having a second width smaller than the first width, wherein the electrode disposed on said one side of the dielectric includes a first electrode and a second electrode respectively connected to external electrodes of the capacitor.

* * * * *